(12) United States Patent
Baker-O'Neal et al.

(10) Patent No.: US 10,199,516 B2
(45) Date of Patent: Feb. 5, 2019

(54) METHOD FOR FABRICATING A PHOTOVOLTAIC DEVICE BY UNIFORM PLATING ON DIELECTRIC PASSIVATED THROUGH-WAFER VIAS AND INTERCONNECTS

(71) Applicants: International Business Machines Corporation, Armonk, NY (US); REC Solar Pte. Ltd., Singapore (SG)

(72) Inventors: Brett Caroline Baker-O'Neal, Sleepy Hollow, NY (US); Shu-Yun Chong, Singapore (SG); John Michael Cotte, New Fairfield, CT (US); Ronald Dean Goldblatt, Yorktown Heights, NY (US); Jeffrey Hedrick, Montvale, NJ (US); Qiang Huang, Croton on Hudson, NY (US); Susan Huang, Mount Kisco, NY (US); Laura Louise Kosbar, Mohegan Lake, NY (US); Rob Steeman, Singapore (SG); Roland Yudadibrata Utama, Singapore (SG)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/644,768

(22) Filed: Jul. 8, 2017

(65) Prior Publication Data
US 2017/0309760 A1 Oct. 26, 2017

Related U.S. Application Data

(62) Division of application No. 14/663,115, filed on Mar. 19, 2015, now Pat. No. 9,716,192.
(Continued)

(51) Int. Cl.
*H01L 31/0224* (2006.01)
*H01L 31/18* (2006.01)
(Continued)

(52) U.S. Cl.
CPC .. *H01L 31/02245* (2013.01); *H01L 31/02167* (2013.01); *H01L 31/068* (2013.01);
(Continued)

(58) Field of Classification Search
CPC ......... H01L 31/02245; H01L 31/02167; H01L 31/068; H01L 31/1804; H01L 31/1868;
(Continued)

(56) References Cited

U.S. PATENT DOCUMENTS

| 3,582,701 A | 6/1971 | Zeliotis |
| 4,609,565 A | 9/1986 | Yates |

(Continued)

FOREIGN PATENT DOCUMENTS

| WO | WO200001019 | 1/2000 |
| WO | WO2006130910 | 12/2006 |

OTHER PUBLICATIONS

ILS TT High Speed Crystalline Solar Cell Processing, Innolas Solutions GMBH, May 2014, pp. 1-2.
(Continued)

*Primary Examiner* — Marc Armand
*Assistant Examiner* — Younes Boulghassoul
(74) *Attorney, Agent, or Firm* — L. Jeffrey Kelly; Otterstedt, Ellenbogen & Kammer, LLP

(57) ABSTRACT

Photovoltaic devices are formed by laser drilling vias through silicon substrates and, following surface preparation of the via sidewalls, plating a continuous, electrically conductive layer on the via sidewalls to electrically connect the emitter side of the cell with the back side of the cell. The electrically conductive layer can be formed on portions of a (Continued)

base emitter within the vias and on the back side of the substrate. Alternatively, the electrically conductive layer can be formed on a passivation layer on the via sidewalls and back side of the cell.

5 Claims, 30 Drawing Sheets

Related U.S. Application Data

(60) Provisional application No. 61/971,817, filed on Mar. 28, 2014.

(51) Int. Cl.
*H01L 31/0216* (2014.01)
*H01L 31/068* (2012.01)

(52) U.S. Cl.
CPC ........ *H01L 31/1804* (2013.01); *Y02E 10/547* (2013.01); *Y02P 70/521* (2015.11)

(58) Field of Classification Search
CPC ........... H01L 31/02168; H01L 31/0224; H01L 31/0216; H01L 31/18; H01L 31/022433; H01L 31/022441; H01L 31/022458; H01L 31/04; H01L 31/0236; H01L 31/022425; H01L 31/03529; H01L 21/76898; H01L 31/0201; H01L 31/0516; H01L 31/186
USPC ........ 136/256, 244, 255, 252, 261; 257/461, 257/465, 466, 437, 448; 438/98, 80, 72, 438/81, 71, 548, 57, 653
See application file for complete search history.

(56) References Cited

U.S. PATENT DOCUMENTS

| | | | |
|---|---|---|---|
| 6,384,317 B1 | 5/2002 | Kerschaver et al. | |
| 7,144,751 B2 | 12/2006 | Gee et al. | |
| 2006/0267117 A1 | 11/2006 | Jaiswal | |
| 2007/0232005 A1 | 10/2007 | Maruyama et al. | |
| 2009/0126786 A1 | 5/2009 | Dominguez et al. | |
| 2009/0183768 A1 | 7/2009 | Wenham et al. | |
| 2010/0243040 A1* | 9/2010 | Kim | H01L 31/02245 136/255 |
| 2010/0258177 A1* | 10/2010 | Ko | H01L 31/02168 136/256 |
| 2010/0319766 A1* | 12/2010 | Suh | H01L 31/02245 136/256 |
| 2011/0005582 A1* | 1/2011 | Szlufcik | H01L 31/02245 136/252 |
| 2011/0048529 A1* | 3/2011 | Lee | H01L 31/068 136/256 |
| 2011/0057283 A1 | 3/2011 | Tsunemi et al. | |
| 2011/0139243 A1 | 6/2011 | Shim et al. | |
| 2011/0272020 A1* | 11/2011 | Biro | H01L 31/02245 136/256 |
| 2012/0032326 A1* | 2/2012 | Kim | H01L 23/147 257/738 |
| 2012/0122272 A1 | 5/2012 | Rana et al. | |
| 2012/0270356 A1 | 10/2012 | Moon et al. | |
| 2012/0288980 A1 | 11/2012 | Moon et al. | |
| 2012/0298192 A1* | 11/2012 | Zhang | H01L 31/02245 136/256 |
| 2013/0008501 A1* | 1/2013 | Guillevin | H01L 31/02245 136/256 |
| 2013/0065351 A1 | 3/2013 | Baker-O'Neal et al. | |
| 2013/0269777 A1* | 10/2013 | Jin | H01L 31/1804 136/261 |
| 2015/0037972 A1 | 2/2015 | Danek et al. | |
| 2015/0255344 A1 | 9/2015 | Ebefors et al. | |
| 2015/0280022 A1 | 10/2015 | Baker-O'Neal | |
| 2015/0325716 A1 | 11/2015 | Baker-O'Neal | |

OTHER PUBLICATIONS

Baird, Brian et al., Picosecond Ablation of Silicon Nitride Using 532 NM Master Oscillator Fiber Power Amplifier for Patterning Crystalline Silicon Photovoltaic Cells, ICALEO 2010, Sep. 26-30, 2010, Anaheim, California, pp. 1-20.

* cited by examiner

FIG. 1
PRIOR ART
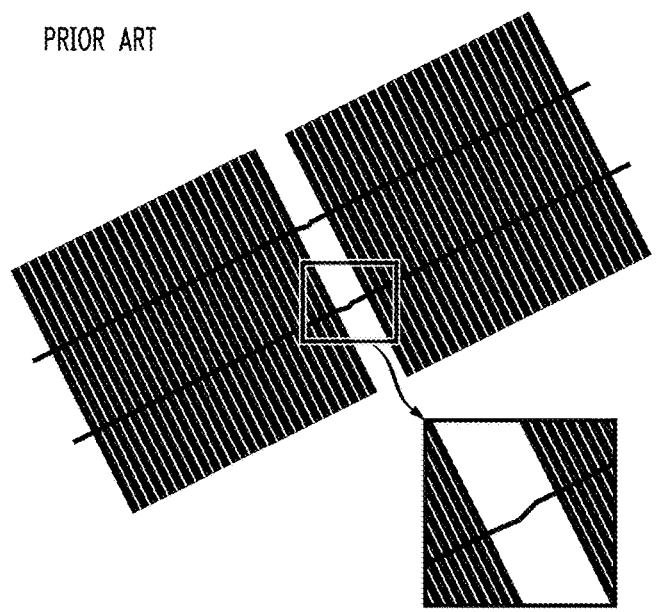
FIG. 2
EXAMPLE OF POSSIBLE FRONT GRID
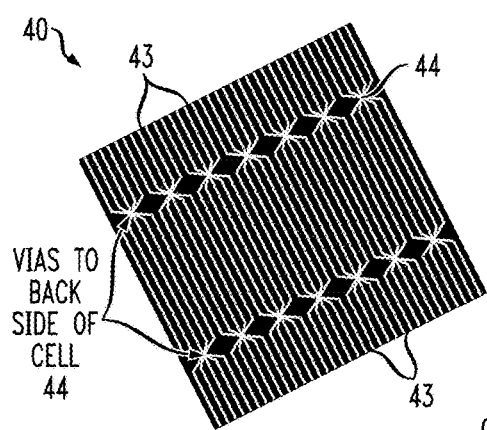
EXAMPLE OF POSSIBLE BACK CONTACT PADS
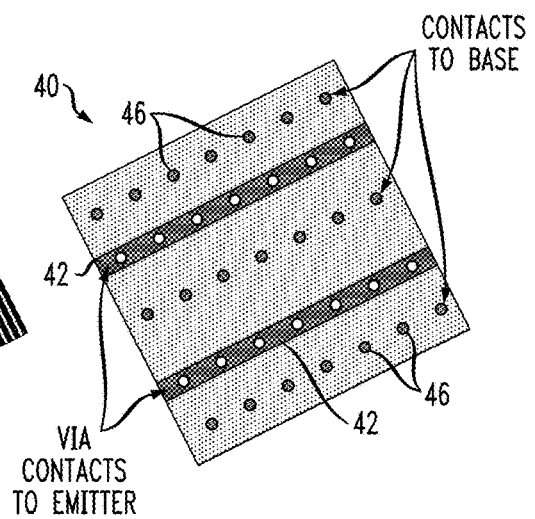

FIG. 11

SHEET RESISTANCE DATA MEASURED IN THE BUSBARS POST SILICIDE ANNEAL AND UN-REACTED NICKEL ETCH FOR CELLS WITH 120, 160 AND 200 OHMS/SQ. EMITTERS

| SAMPLE | EMITTER RESISTIVITY (ohms/sq) | ANNEAL TEMPERATURE (C) | ANNEAL TIME (min) | Rs (ohms/sq) |
|---|---|---|---|---|
| 120-1 | 120 | 320 | 5 | 21 +/- 9 |
| 120-3 | 120 | 320 | 5 | 14 +/- 3 |
| 160-7 | 160 | 320 | 5 | 33 +/- 15 |
| 160-11 | 160 | 320 | 5 | 16 +/- 5 |
| 200-15 | 200 | 320 | 5 | 44 +/- 24 |
| 200-13 | 200 | 320 | 5 | 33 +/- 20 |

TARGET AND ACTUAL FRONT AND REAR VIA DIAMETERS

| TARGET DIAMETER | ACTUAL REAR DIAMETER | ACTUAL FRONT DIAMETER | RATIO (r/f) |
|---|---|---|---|
| 60 μm | 67 μm | 35 μm | 1.91 |
| 120 μm | 105 μm | 65 μm | 1.62 |
| 200 μm | 215 μm | 170 μm | 1.26 |

POST LASER DRILL ETCH MATRIX

| GROUP | DESCRIPTION | SEM INSPECTION | POCl AND BACKSIDE Al |
|---|---|---|---|
| A | KOH 35% w/v, 80C, 5min | 1 pc | 5 pcs |
| B | Std PROD LINE SDE 1x | | |
| C | Std PROD LINE SDE 3x | | |
| D | Std PROD LINE SDE 5x | | |

BENCH TOP PLATING SETUP

SUMMARY OF RESULTS ON THE IMPACT OF POST LASER DRILL
ETCH AND PRE-PLATE SURFACE PREP ON Ni/Cu PLATING

| POST LASER ETCH | NO HF | HF BACK ONLY | HF FRONT AND BACK |
|---|---|---|---|
| KOH | NONE | RIMS ONLY | FULL COVERAGE |
| 1X SDE | NONE | SPARSE NODULES | NODULES AND SMOOTH REGION |
| 3X SDE | NONE | RIMS AND NODULES | FULL COVERAGE |
| 5X SDE | NONE | SPARSE NODULES | FULL COVERAGE |

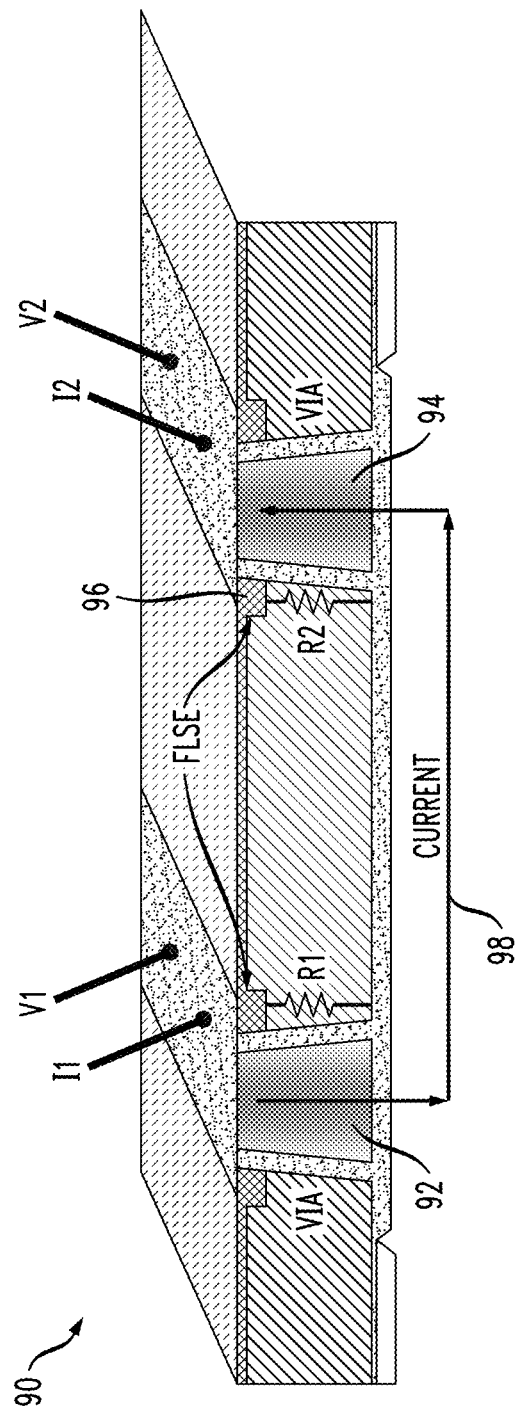

FRONT

BACK

FIG. 28

| | GROUP A | | | | GROUP B | | | NOTES |
|---|---|---|---|---|---|---|---|---|
| Pcs. | 3 | 3 | 3 | 3 | 3 | 3 | 3 | |
| LASER DRILL | | X | | | | X | | d=70-280μm WITH 30μm INCREMENTS LASER SETTINGS: 30A/15kHz/100mm/s |
| KOH ETCH | | X | | | | X | | KOH 20%(w/v), 80°C, 5mins |
| POCl₃ DIFFUSION | | X | | | | X | | TARGET 40 ohm/sq, DOUBLE-SIDED DIFF. |
| PSG ETCH | | X | | | | X | | |
| THERMAL OXIDATION | | X | | | | X | | 25nm OXIDE PROTECTS SIDEWALL EMITTER? |
| FRONT PECVD SiNx | | | X | | | | X | SiN RESIDUE PROTECTS SIDEWALL EMITTER? |
| SINGLE SIDE ETCH | 2μm (REAL 1.35μm) | | | | 5μm (REAL 6-8μm) | | | VARY ETCH LOSS |
| FRONT PECVD SiNx | X | X | | | | X | | |
| PRINT 2 (Al) | | X | | | | X | | |
| FIRING | | X | | | | X | | |

FIG. 29

| | GROUP A | NOTES |
|---|---|---|
| Pcs. | 3 pcs | |
| LASER DRILL | X | |
| KOH ETCH | X | |
| REAR PECVD AlOx | X | 50nm |
| REAR PECVD SiNx | X | 75nm |
| SPUTTERED Ti/Cu | X | 30nm/500nm |
| POLISHED XSECTION | X | 280, 160, 70μm DIAMETERS |

METHOD FOR FABRICATING A PHOTOVOLTAIC DEVICE BY UNIFORM PLATING ON DIELECTRIC PASSIVATED THROUGH-WAFER VIAS AND INTERCONNECTS

CROSS-REFERENCE TO RELATED APPLICATION

This patent application is a divisional of U.S. patent application Ser. No. 14/663,115 filed Mar. 19, 2015, which in turn claims the benefit of U.S. Provisional Patent Application Ser. No. 61/971,817 filed on Mar. 28, 2014. The disclosures of the aforementioned U.S. patent application Ser. No. 14/663,115 and Provisional Patent Application Ser. No. 61/971,817 are expressly incorporated herein by reference in their entireties for all purposes.

FIELD

The present disclosure generally relates to the electronic arts, to vias having conductive surfaces, and to methods for forming photovoltaic devices including such vias.

BACKGROUND

The manufacture of silicon photovoltaics is a very cost and performance sensitive industry. Standard silicon photovoltaics (PV) manufacture includes screen printed silver paste to form a front grid pattern that includes "fingers" to collect the current generated over the surface of the solar cell and perpendicular "busbars" which collect all of the current from the fingers. Copper strips are soldered onto the busbars and interconnected with the busbars on the back surface of a subsequent solar cell to allow the cells in the modules to be connected in series, as shown in FIG. 1. This process is undesirable for several reasons. The metallization on the grid pattern is opaque, so it "shadows" or prevents light absorption (and so electrical generation) over the areas covered by the grid. Screen printed grids limit the size of the fingers to about 50 µm, and the busbars are generally close to 2 mm wide—resulting in shadowing of about 6-7% of the front surface of the PV cell, which significantly reduces the potential cell performance. The busbars, which collect very little current from the cell itself but primarily act as a conduit for the current from the fingers to the external contacts, contribute about half of the total shadowing of the surface.

In addition to shadowing, the interconnection of the front and back busbars requires soldering metal strips to both the front and back surfaces of the cells, which can create stresses in the very thin silicon wafers and lead to breakage. The bending of the copper strips can also induce stresses near the edges of the cells, and it requires space to exist between the cells, decreasing cell packing density and increasing the overall size of the module.

SUMMARY

Principles of the present disclosure provide techniques for the fabrication of a photovoltaic device. An exemplary method includes obtaining a substrate comprising silicon and including a front side and a back side, laser drilling one or more vias through the substrate, each of the one or more vias including a sidewall, and smoothing the sidewall of each of the one or more vias. A doped emitter is formed on at least the front side of the substrate and an electrically conductive contact pad is formed on the back side of the substrate. An antireflective coating is formed on the doped emitter. The method further includes plating a continuous, electrically conductive layer on each sidewall of the one or more vias, thereby forming one or more plated vias, each plated via having an axial opening, whereby the continuous, electrically conductive layer of each of the one or more plated vias is electrically connected to the doped emitter.

An exemplary photovoltaic device includes a base comprising silicon and having a front side, a back side and a doped base emitter adjoining the front side of the base. A doped, selective emitter adjoins the base emitter and an anti-reflective coating is on the doped base emitter. One or more vias extend through the base and the doped, selective emitter, each of the one or more vias including a sidewall and an axial passage. An electrically conductive layer is on the sidewall of each of the one or more vias and bounds each axial passage. The electrically conductive layer electrically connects the doped, selective emitter and the back side of the base. A plated metal contact is on the back side of the base and is contiguous with the electrically conductive layer. A base contact is also on the back side of the base. The plated metal contact and the base contact are electrically isolated from each other. Thus, the back side of the base includes both base and emitter contacts, the latter being connected to the doped, selective emitter on the front side of the base through the one or more vias.

Techniques of the present invention can provide substantial beneficial technical effects. For example, one or more embodiments may provide one or more of the following advantages:

Reduction of shadowing in photovoltaic cells.
Possible reduction of cell stress and breakage.
Allows cells to be placed in relatively close proximity in a module, increasing the active area and reducing the size of the module.
Allows simultaneous plating of the back surface, via sidewalls and front grid fingers of a photovoltaic cell.
Provides uniform and continuous metal plating of via sidewalls for reliable current transport from emitter contacts on the front surface of a cell to contact pads on the back surface.
Allows use of plated contacts which may have reduced contact resistance and increased conductivity compared to screen printed pastes.

These and other features and advantages of one or more embodiments will become apparent from the following detailed description of illustrative embodiments thereof, which is to be read in connection with the accompanying drawings.

BRIEF DESCRIPTION OF THE DRAWINGS

FIG. 1 is a schematic illustration of a prior art photovoltaic device including busbars on the front surface;

FIG. 2 is a schematic illustration of an exemplary photovoltaic cell with conductive through holes and all electrical contacts on the back surface;

FIG. 11 is a table showing sheet resistance data measured in the busbars post-silicide anneal and unreacted nickel etch for cells with 120, 160 and 200 ohms/sq. emitters;

FIG. 22 shows a schematic illustration of a cell as configured for four point probe continuity measurements of a plated via structure;

FIG. 28 shows a table including an experimental matrix and sample process flow for a via sidewall emitter;

FIG. 29 shows a table including sample fabrication details for via sidewall dielectric coverage evaluation;

DETAILED DESCRIPTION

Figure 3:
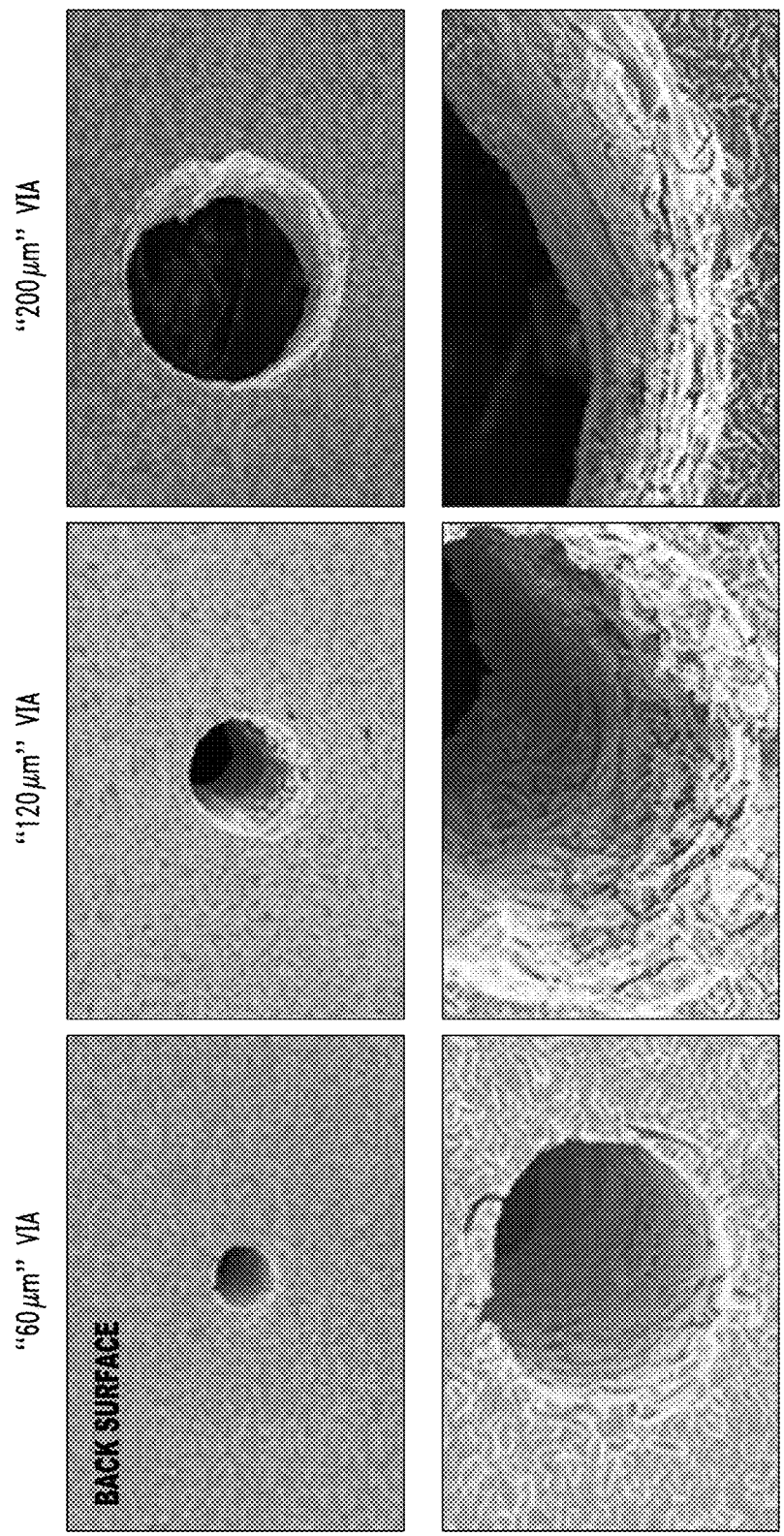
FIG. 3 is a scanning electron micrograph (SEM) of direct and radially laser drilled vias showing surface roughness on the walls of the vias.

Photovoltaic cells are disclosed having reduced shadowing through elimination of busbars. Such reduced shadowing is achieved by transporting the current to the back surfaces of the cells. Holes are created in solar cell substrates and lined with a conductive material. If cell fingers 43 are designed to contact these conductive through holes 44, as shown in FIG. 2, the current from the front surface can be collected at contacts 42 on the back surface of the cell 40. Base contacts 46 are also provided on the back surface. If combined with laser patterned and electroplated patterning of the fingers, which can produce much narrower finger widths, the total shadowing of the front surface can be significantly reduced.

An added benefit of one or more embodiments of the processes disclosed further below is that both n and p interconnects (elements 42, 46 in FIG. 2) are formed on the back surface of the cell, thereby reducing stress and cell breakage. This also allows the cells to be placed in closer proximity to each other in a module—increasing the active area and reducing size of the modules.

Metal wrap through (MWT) technology, as discussed further below, enables the reduction of silicon thickness, increases performance, and improves module level yield of silicon-based solar cells. Current module assembly daisy chains cells together front to back going from cell to cell using solder coated metal ribbons. The current carrying capability of the ribbon interconnects is defined by the ribbon thickness—the thicker the ribbon the more current it can carry. A significant issue associated with ribbon thickness is cell breakage during assembly due to stresses transferred by thick ribbons and increased spacing between cells (lower packing density) due to limited ribbon flexure. MWT transfers current from the front side of the cell to the backside by providing conductive pathways through vias in the silicon. This allows cells to be interconnected from the backside, with no limitation on ribbon thickness. In addition, MWT technology reduces shadowing by eliminating the busbars, which can contribute close to half of the shadowing losses, from the front (sunny side) surface. MWT technology also enables transition to thinner wafers by eliminating ribbon stresses, and allows for monolithic module assembly, as both the emitter and base contacts are on the backside of the wafer. Forming a conductive pathway from the front to the back of the solar cell can be accomplished either by filling or lining vias with a conductive media, such as conductive paste or plated metal. The present disclosure is focused on the formation of metal lined vias using electrodeposition. One goal is to leverage and extend a copper (Cu) plated front grid with fine line selective emitter (FLSE) technology to a MWT application. The combination of front grid and via metallization is potentially a cost effective method of fabricating next generation, high performance PV cells.

Two different cell structures are described below as well as the impact of via formation on via metallization. The via formation method used in accordance with the exemplary embodiments includes laser drilling. The two cell structures explored are referred to as "emitter lined via" and "dielectric passivated via".

In accordance with a first aspect, a process for the fabrication of photovoltaic cells with an electroplated front surface finger grid pattern electrically connected through electroplated vias to interconnects on the back surface of the cells is disclosed in conjunction with the "emitter lined via." This process utilizes laser drilling to create the through holes in the silicon, as well as laser patterning of the fingers on the front surface of the cell. The process further allows simultaneous plating of the back surface, via sidewalls, and front grid fingers, minimizing the cost and manufacturing time. The back surface includes a dielectric layer and a seed layer as plating of the base contact is ineffective on lightly doped base silicon and there must be electrical isolation between the base and emitter contacts. Uniform and continuous plating of vias is obtained to ensure reliable current transport from the emitter contacts on the front surface of the cell to metallized contact pads on the back surface thereof.

Formation of holes, or vias, in silicon can be accomplished in numerous ways, including patterning and wet chemical etching, reactive ion or other forms of dry chemical etching, or through the use of lasers to ablate the silicon. Laser drilled vias can be fabricated using direct drilling or radial drilling techniques. For direct drilling, the laser impinges on the wafer in only one spot, and the diameter of the via is dependent on the diameter of the laser. In the case of the examples discussed below, the direct drilled vias are 60-70 µm in diameter. For radial drilling, the laser is moved in a circular pattern, cutting through the thickness of the wafer as it moves. The diameter of a radially drilled via is flexible and can be significantly larger than the diameter of the laser beam, but radially drilled vias will take longer to cut than direct drilled vias. In the case of these examples, the radially drilled vias are from 100-280 µm in diameter. Either technique, however, tends to produce very rough via sidewalls, as can be seen in FIG. 3.

Figure 4:
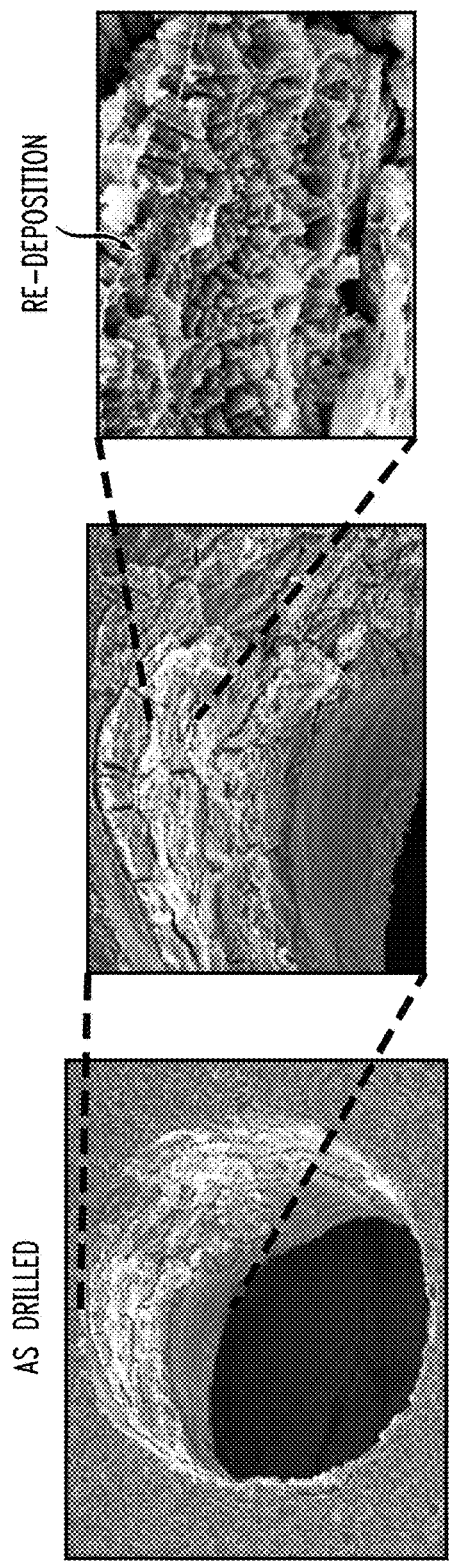
FIG. 4 shows SEM images laser drilled vias having redeposited material.

There is often a significant amount of residue or re-deposited material on the via sidewalls after drilling, as demonstrated in FIG. 4.

Figure 5:
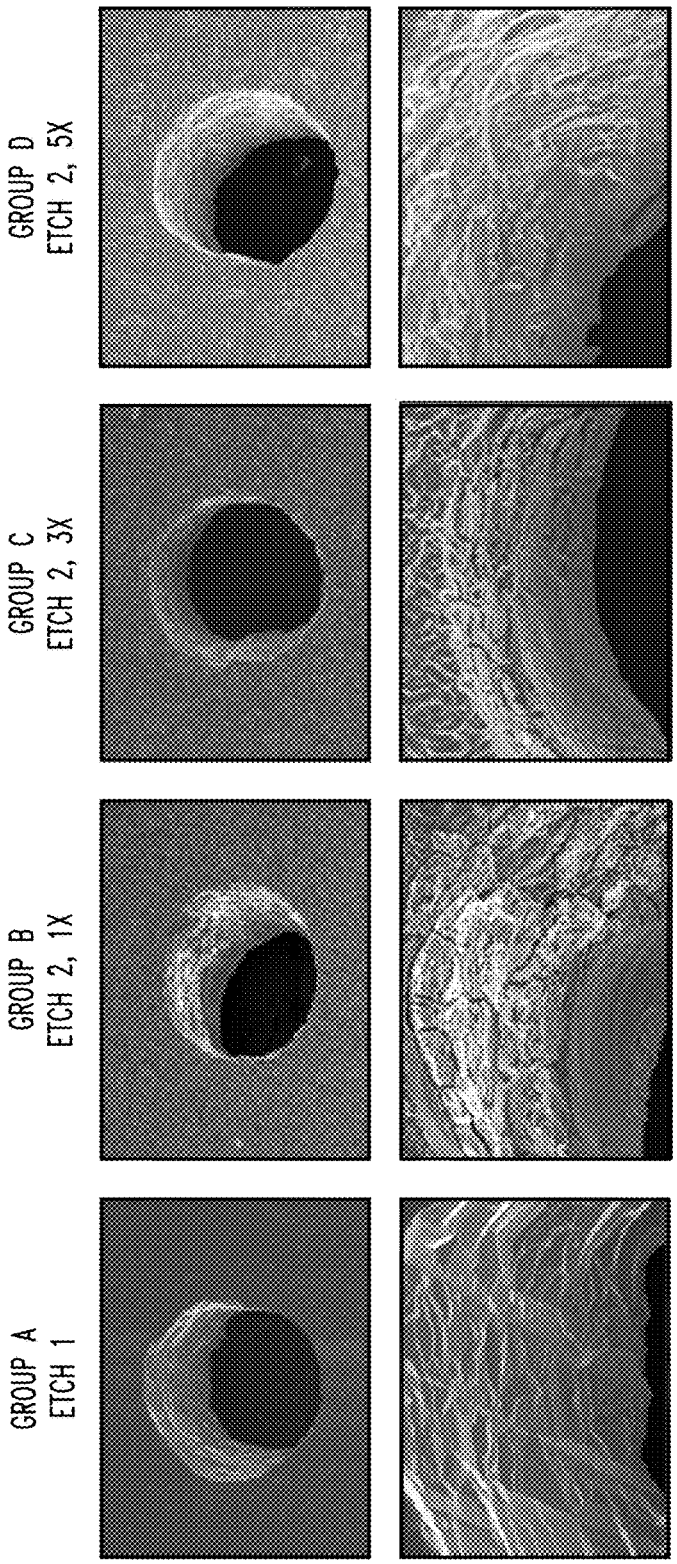
FIG. 5 shows SEM images of via sidewalls after exposure to two different wet chemical etches, the exposure time for Etch 2 being varied by up to a factor of five.

Removal of the laser drilling residue and smoothing of the via sidewalls may be accomplished using several different wet chemical treatments, including a single sided KOH etch (identified as "Etch 1") and a conventional saw damage etch (identified as "Etch 2") for varying lengths of time, as shown in FIG. 5. The KOH etch is very effective at removing any residues on the via sidewalls as well as smoothing out some of the sidewall roughness. The saw damage etch was also fairly effective at removing sidewall residues for long exposure times.

Figure 6:
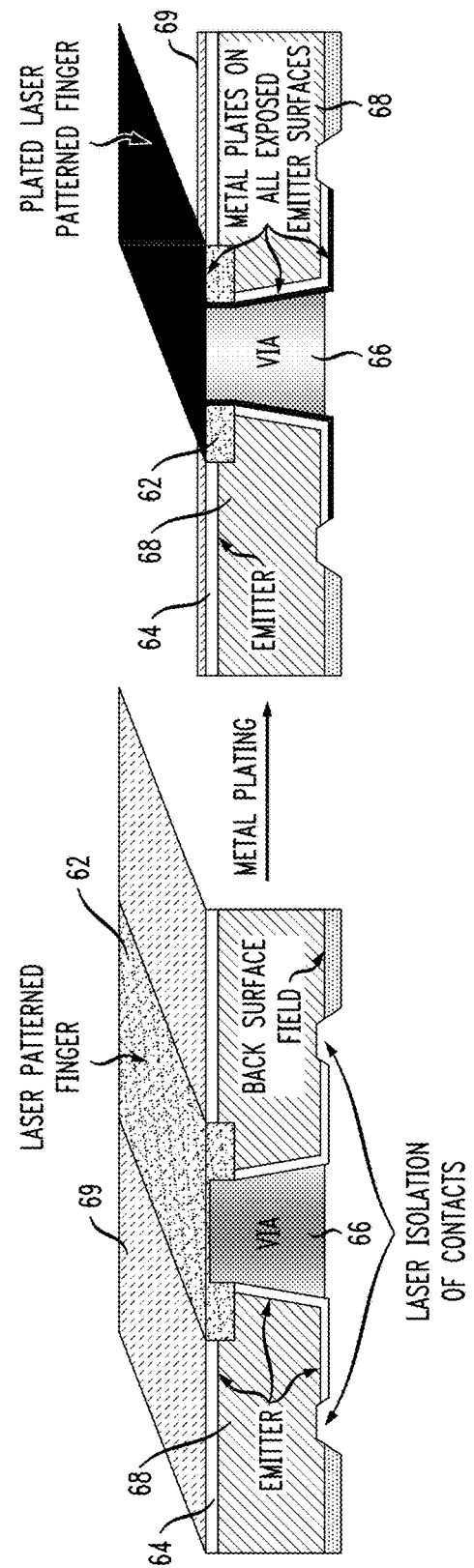
FIG. 6 is a schematic representation of laser drilled vias and exposed emitter before and after metal plating.
Figure 7:
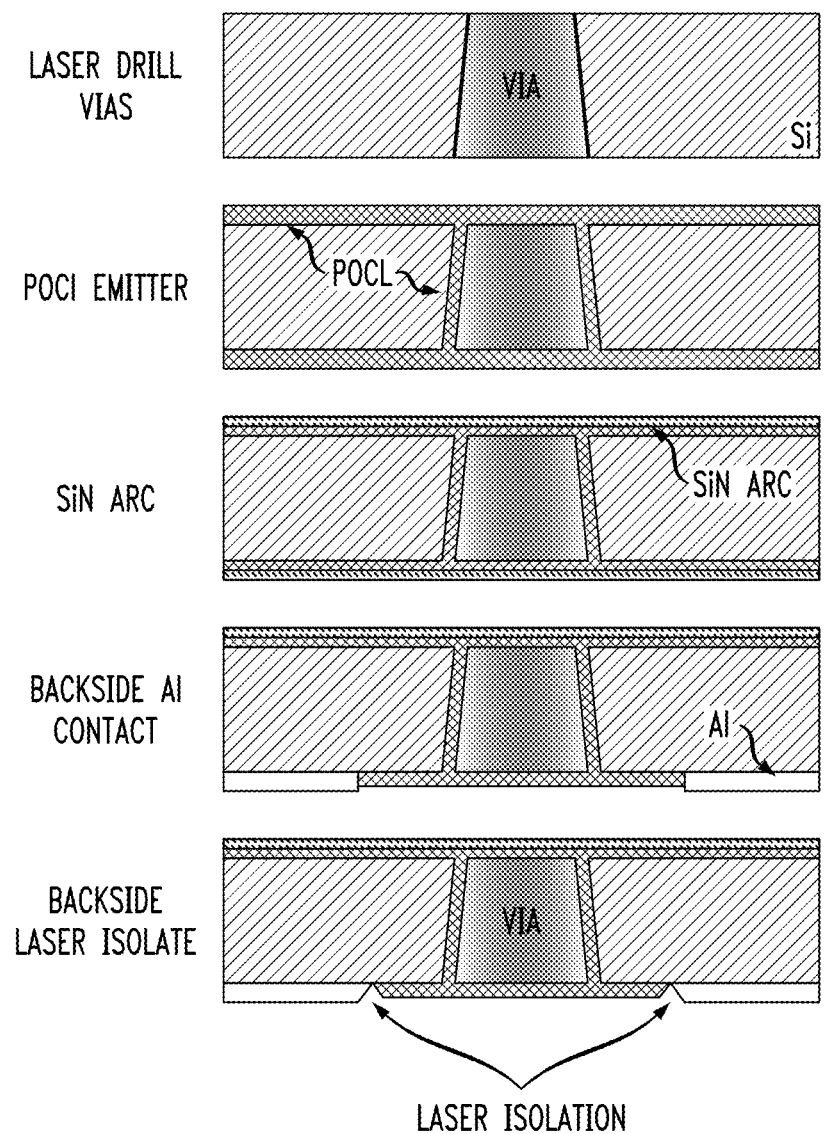
FIG. 7 shows a process flow for fabricating an emitter-lined via in a photocell.
Figure 8:
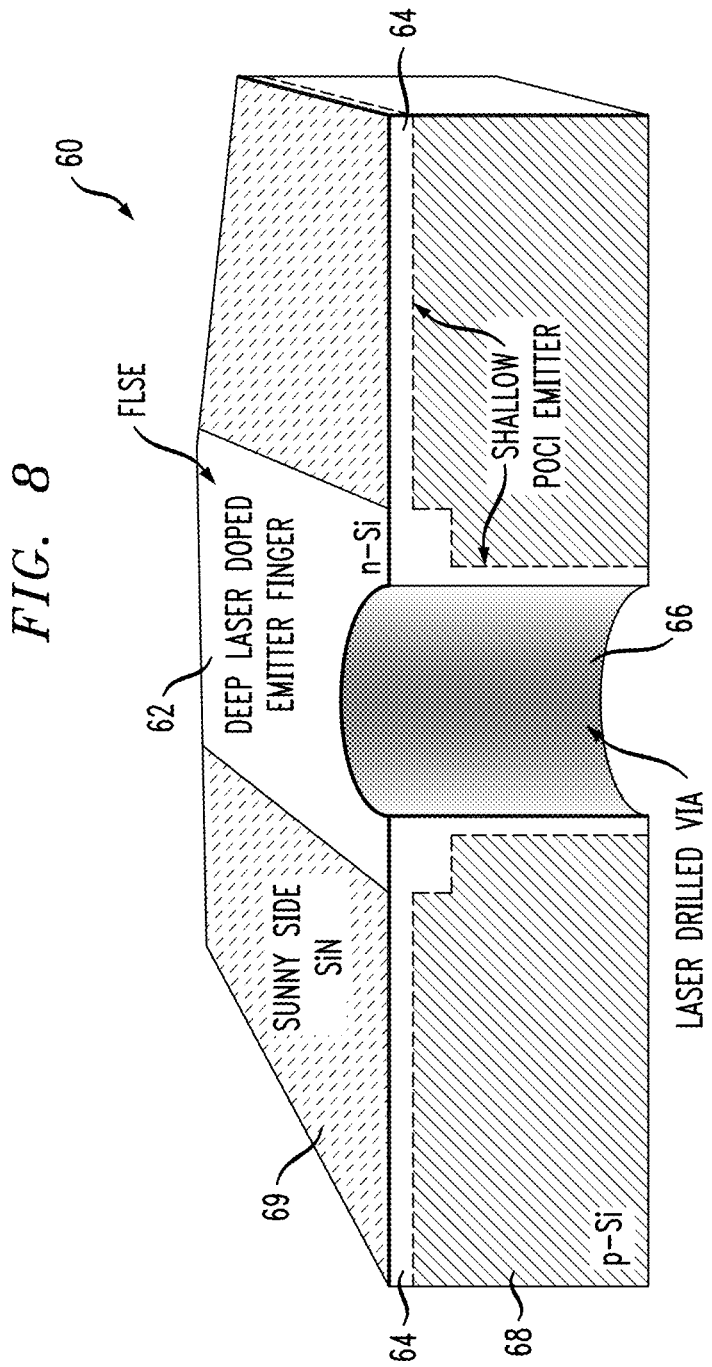
FIG. 8 is a schematic illustration of a photocell including a fine line selective emitter including a lightly doped base emitter and a heavily doped selective emitter.

Etching of the vias occurs after texturing of the front surface of the wafer in one or more embodiments of the process, but before emitter diffusion. In embodiments including dielectrically passivated via(s), laser drilling could be conducted following emitter diffusion. Etching can be accomplished as part of a single sided etch process from the back side of the cell. This process would then be followed by emitter diffusion (POCL), such that the background emitter is continuous between the front surface of the cell and the sidewalls of the vias. After phosphorus doped silicon glass (PSG) removal, the subsequent steps include front surface anti-reflective coating (ARC) deposition (plasma enhanced chemical vapor deposition (PECVD) SiN in an exemplary embodiment), patterning of emitter contacts on the front surface (in this example using laser patterned fine line selective emitter (FLSE)), formation of a back surface field (BSF) (using screen printing and firing of aluminum paste in an exemplary embodiment), laser isolation of the emitter and base contacts on the backside of the wafer, and plating of metal on the front emitter contacts and via sidewalls. The metal should plate on all areas with exposed emitter, as shown schematically in FIG. 6. A flow chart schematically illustrating selected process steps is illustrated in FIG. 7. The portion of the emitter surrounding the via on the back side of the structure can be formed by 1) structuring the emitter (through masking before diffusion or by selectively removing the emitter on the back side after diffusion, or 2) causing diffusion of the entire back side; the base contact formation using aluminum, as shown in FIG. 7, will overcompensate the diffusion in the base contact areas. The schematic drawings, such as included in FIGS. 6-8, are not necessarily to scale. For example, the backside aluminum contact is much thicker than the adjoining emitter portion. In some embodiments, the emitter thickness is about 0.5 µm while the Al-BSF layer is about 5 µm to overcompensate for emitter diffusion. A partially completed photovoltaic device 60 is schematically illustrated in FIG. 8 and shows a FLSE 62, a lightly doped base emitter 64 that lines the sidewalls of a laser drilled via 66 and overlies a p-type silicon base 68, and a nitride ARC layer 69 on the base emitter 64. The metallization scheme includes a backside isolation step to separate the emitter and base contact, followed by light induce plating (LIP) of all exposed emitter surfaces. (The same reference numerals are employed in FIGS. 6 and 8 to designate similar elements.)

Figure 9:
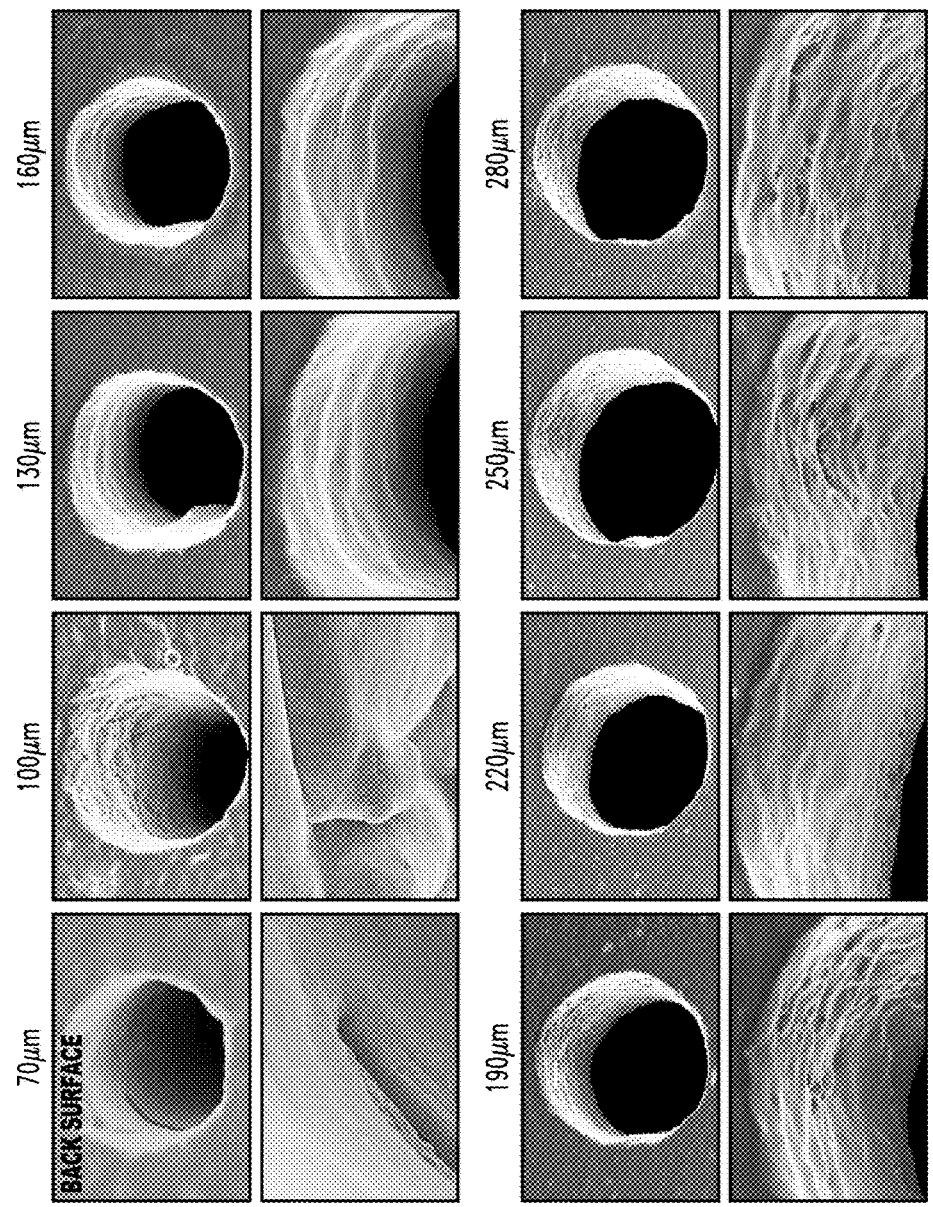
FIG. 9 shows greatly enlarged images of uniformly plated, laser drilled vias with varying diameters.

While removal of the residue and smoothing of the via sidewalls are important to achieve uniform and continuous plated metallization, they are not necessarily sufficient. In many cases a plating "inhibition layer" exists on the sidewall surfaces that can inhibit plating entirely or produce only patchy plating. It was determined that the surface layer that inhibited electroplating could be removed using a hydrogen fluoride (HF) etch, and that after etching continuous or improved plating (in this case electroplating of nickel and copper) was achieved. If residues from the laser drilling still exist, however, uniform metal plating is still not obtained. By using the combination of a post laser via drill etch and an HF etch of the inhibition layer prior to metal plating, uniform plating of the via sidewalls for both direct drilled vias and radially drilled vias with diameters up to at least 280 µm is possible, as shown in FIG. 9.

Figure 10:
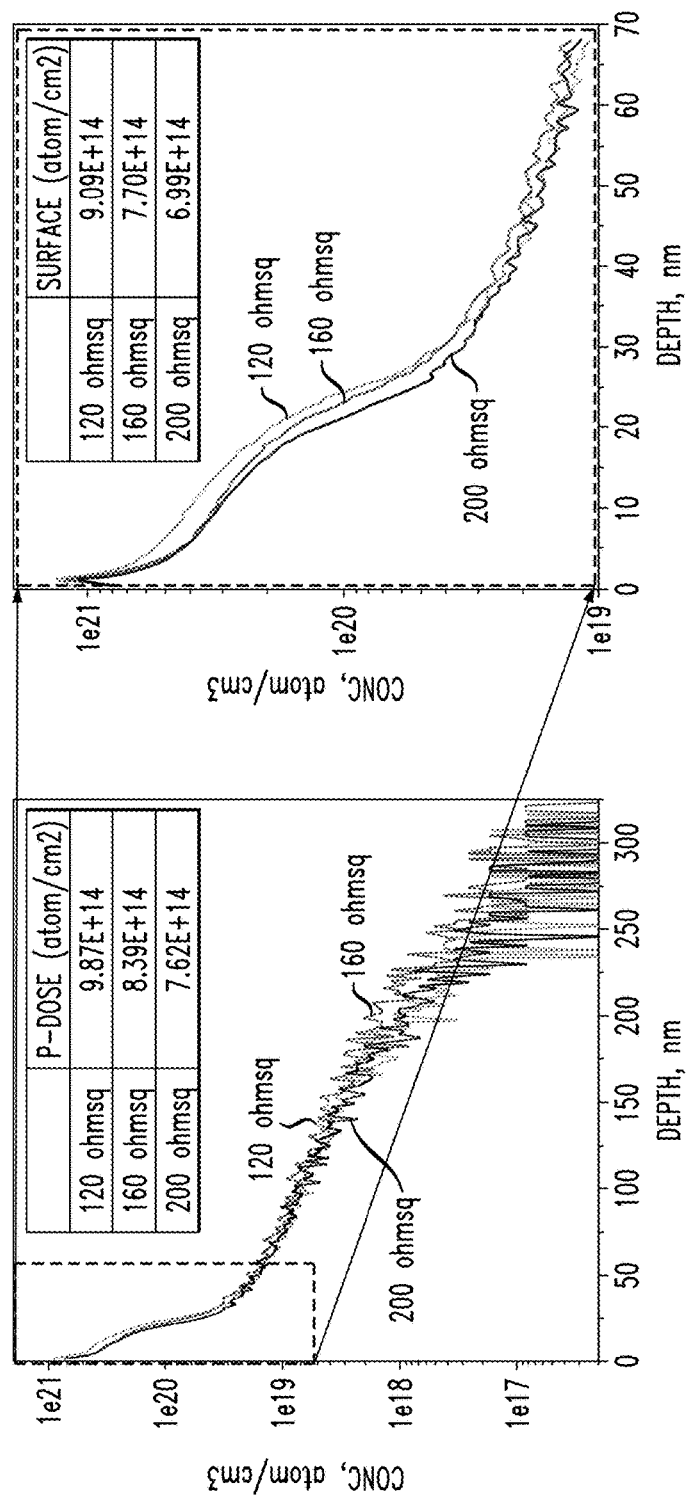
FIG. 10 shows phosphoryl trichloride (POCL) process conditions and corresponding SIMS (secondary ion mass spectrometry) depth profiles for 120, 160 and 200 ohms/sq. emitter.

In order to take advantage of the attributes of FLSE, the background emitter (element 64 in FIG. 8), including the portion of the background emitter on the via sidewall, is targeted to be lowly doped. The process for plating a Cu front grid on the cell requires an anneal step after nickel deposition to form a nickel silicide layer. The silicide functions to improve adhesion with the subsequently plated copper layer and to form good ohmic contact with the emitter. The formation of the nickel silicide requires careful control of time and temperature during the anneal step so that the silicide does not penetrate the underlying emitter, which would result in shunting. The challenge with a device structure that contains both a deep, highly doped FLSE and a shallow, lowly doped background emitter is the formation of a sufficient silicide layer without causing shunting. In order to gain a better understanding of the limitations associated with shallow, lowly doped emitters, experimental cells with various high resistivity emitters were fabricated and characterized. Emitters formed using a phosphoryl chloride (POCL) diffusion process with nominal target resistivities of 120, 160 and 200 ohms/sq. were explored. The POCL process conditions and corresponding secondary ion mass spectrometry (SIMS) depth profiles for all three emitters are shown in FIG. 10.

Full 156 mm×156 mm cells were processed through backside aluminum contact using the following process flow:

Acid texturing
    POC13 emitter diffusion target 120, 160, 200 ohm/sq. sheet resistance
    PSG clean (HF dip)

Front PECVD SiN (ARC)
Rear Al print+firing

Cell fabrication was completed using a copper plated front grid process having the following process flow:
Resist patterning
2:1 DHF etch (nitride open)
O$_2$ ash
50:1 DHF etch (native oxide removal)
Ni plating
Silicide anneal
Un-reacted Ni etch
50:1 DHF etch
Ni flash
Cu plate Silicide formation was evaluated for all three emitters post anneal and etching of the un-reacted nickel. Sheet resistance measurements, taken along the busbars for two samples of each emitter resistivity, were made and are included in the table shown in FIG. 11. The average values of sheet resistance for all three cases indicate the formation of nickel silicide, with the 200 ohms/sq. emitter case having the highest resistivity. Embodiments exhibiting 120 ohms/sq. and 160 ohms/sq. show clear continuous nickel silicide layers, but a spotty, discontinuous silicide layer in the case of the 200 ohms/sq. emitter.

Figure 12A:
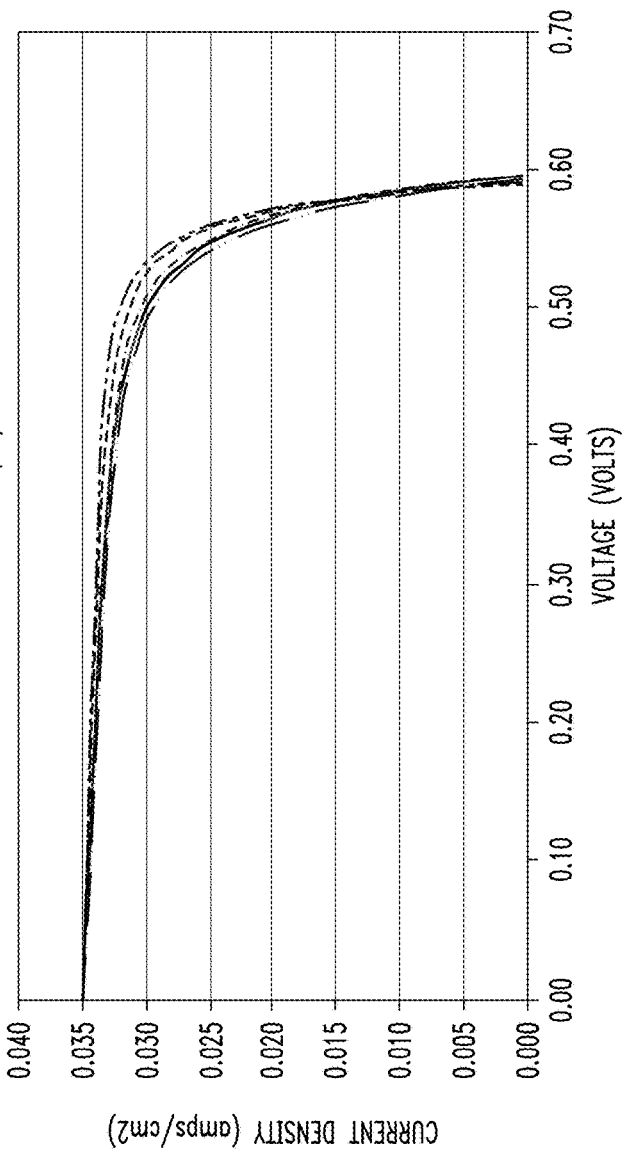
FIGS. 12A-12C show Suns $V_{oc}$ plots and tabulated interim $V_{oc}$ and pFF data for cells fabricated with 120, 160 and 200 ohms/sq. emitters, respectively.
Figure 12B:
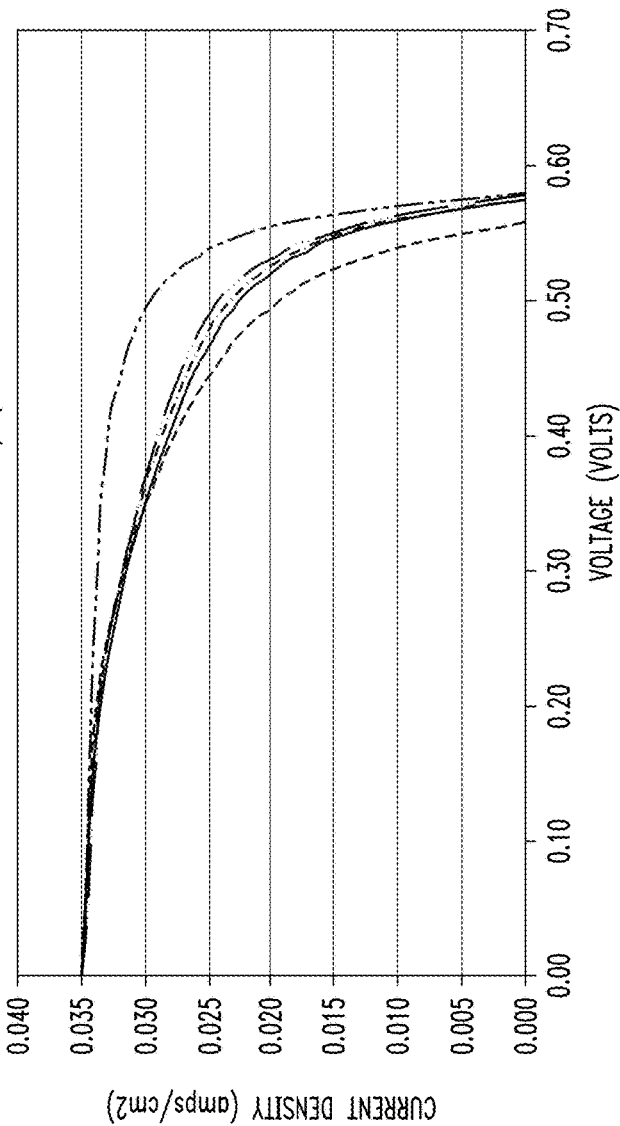
Figure 12C:
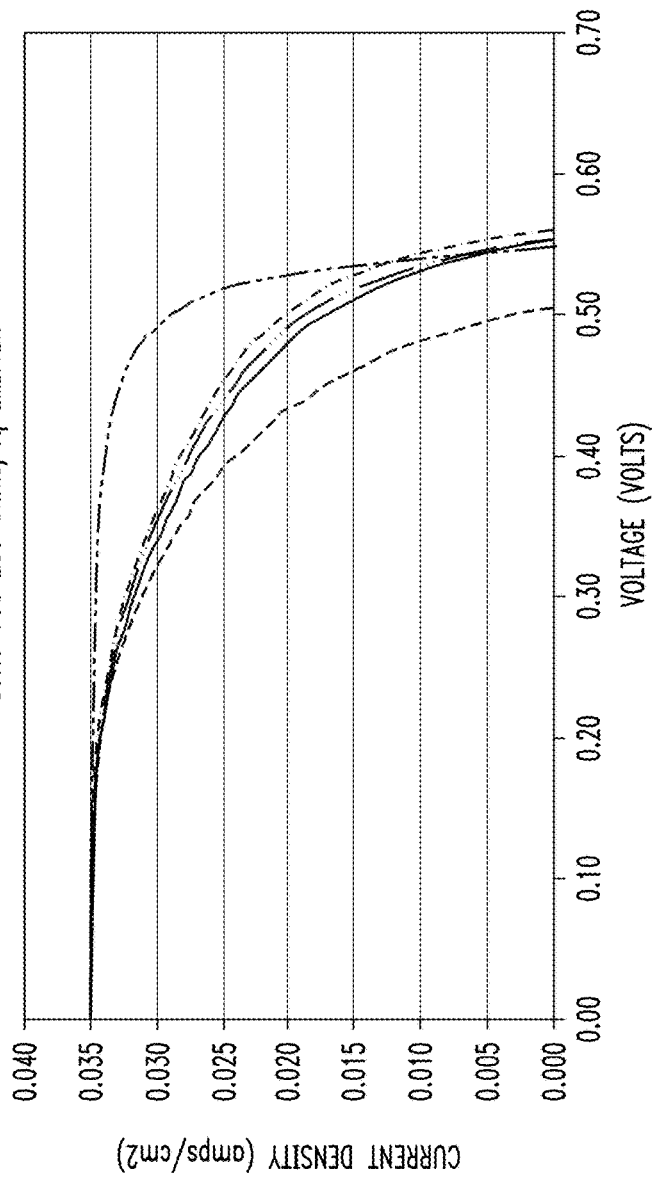

To evaluate the impact of the shallow, lowly doped emitters on cell performance, Suns-Voc measurements were taken after nickel plate, silicide anneal, copper plate, laser edge isolation, and a 200° C. 25-hour anneal in forming gas. Suns-Voc plots and tabulated Voc and pFF data for cells fabricated with the 120 ohms/sq., 160 ohms/sq., and 200 ohms/sq. emitters are shown in FIGS. 12 A, B, and C respectively. As indicated from the data, cells fabricated using the copper plated front grid process show a clear performance dependence on emitter resistivity. A decrease in Voc with increasing emitter resistivity was observed. Interim Suns-Voc measurements indicated a significant drop in both Voc and pFF primarily for the cells with 160 ohms/sq. and 200 ohms/sq. emitters, with no significant degradation post elevated temperature soak. These results suggest that base emitters, for cells with MWT and FLSE, would require resistivities of ~120 ohms/sq. or lower to avoid performance degradation due to shunting during silicide formation.

Figures 13, 14:
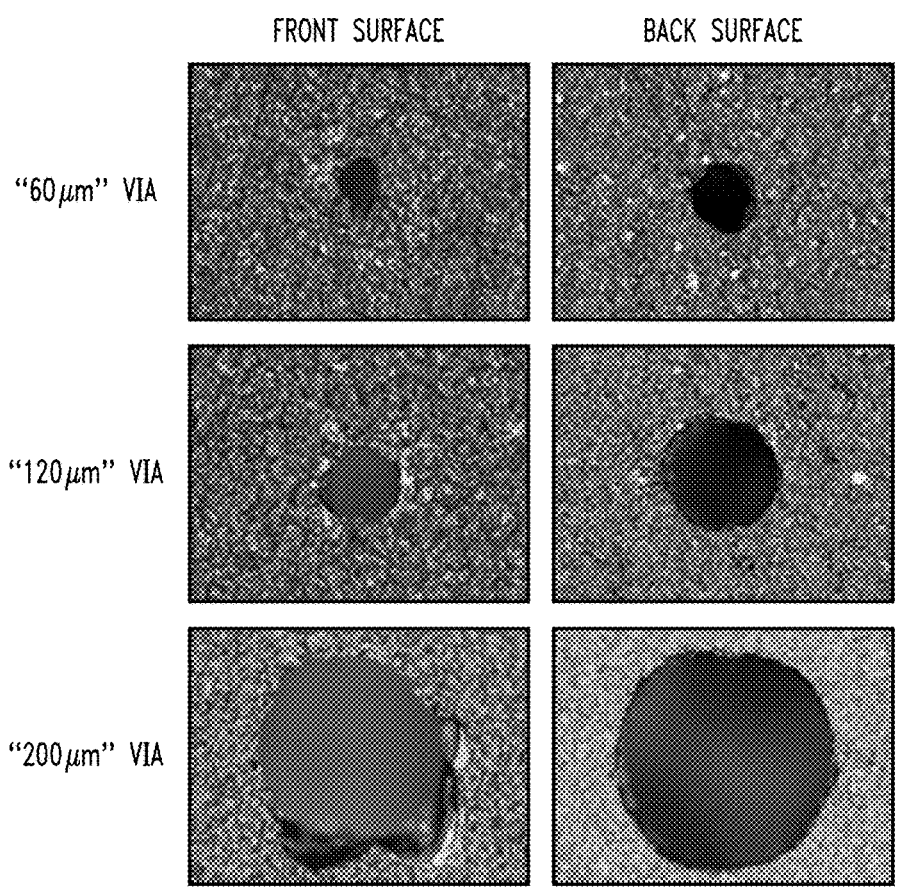
FIG. 13 is a table showing target and actual front and rear via diameters following laser drilling.
FIG. 14 shows optical images of front and rear surfaces of laser-drilled vias.

As discussed above, through wafer vias (element 66 of FIG. 8) are formed in one or more embodiments by laser drilling. Two drilling methods were employed: 1) direct drilling for vias on the order of 70 μm in diameter and 2) radial drilling for vias greater than 70 μm in diameter. Both the direct and radial drilling methods yielded vias with tapered sidewalls, with the laser entry side being larger in diameter than the laser exit side. Initial vias with nominal diameters of 60 μm, 120 μm, and 200 μm were processed as follows:
Laser drilling
Acid texturing
POCl$_3$ emitter diffusion target 120 ohm/sq. sheet resistance
PSG clean (HF dip)
Front PECVD SiN deposition
Rear Al print+firing Via laser drilling was carried out from the backside and the actual front and rear diameters are listed in the table provided in FIG. 13. Optical images of front and rear surfaces are shown in FIG. 14. Via perimeters, on the laser exit side, have irregular shapes with scalloping along edges. The sidewalls of the vias have significant roughness. The radial drilled nominal 120 μm and 200 μm diameter vias appear to have re-deposited material along the sidewalls with a diminishing gradation, going from the laser exit to laser entry side.

Figures 15, 16:
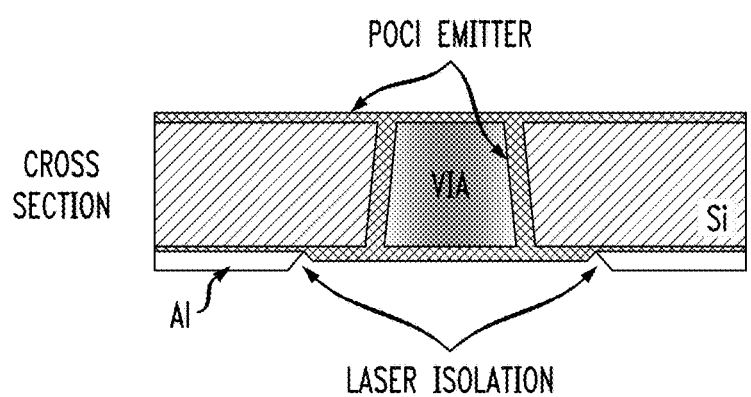
FIG. 15 shows a table indicating various post laser drill etch conditions tested for effectiveness.
FIG. 16 is a schematic cross sectional view of an emitter lined via cell structure with backside laser isolation.

To address the difficulty in nucleating and forming a continuous plated film on the as-drilled via sidewalls, a series of postdrill etches were explored, including a 35% KOH and a standard saw damage etch (SDE) with 1×, 2× and 3× passes, as listed in the table shown in FIG. 15. The 35% KOH etch removed the re-deposited material and left the via with a relatively smooth, uniform sidewall. The standard SDE did not appear to remove the re-deposited material at 1×, but did so for the 3× and 5× cases. The 5× case appeared to introduce additional etch induced topography.

A test vehicle used for metallization included a radially laser drilled via with a nominal diameter of 250 μm. The post laser drill etch used was 35% KOH/80° C./5 minute etch. Samples were processed through backside contact and laser isolation as follows:
Laser drilling; via shape is conical; 250 μm rear diameter, 215 μm front diameter
KOH etch
POCl$_3$ emitter diffusion target 120 ohm/sq. sheet resistance
PSG clean (HF dip)
Front PECVD SiN ARC
Rear Al print+firing The cell configuration employed was an emitter lined via which required backside isolation to eliminate a shunt between the continuous emitter and the aluminum-fired back contact and is illustrated in FIG. 16. Full 156×156 mm cells with a row of vias along isolated busbar zones were laser diced into coupons used for individual plating experiments.

Figures 17, 18:
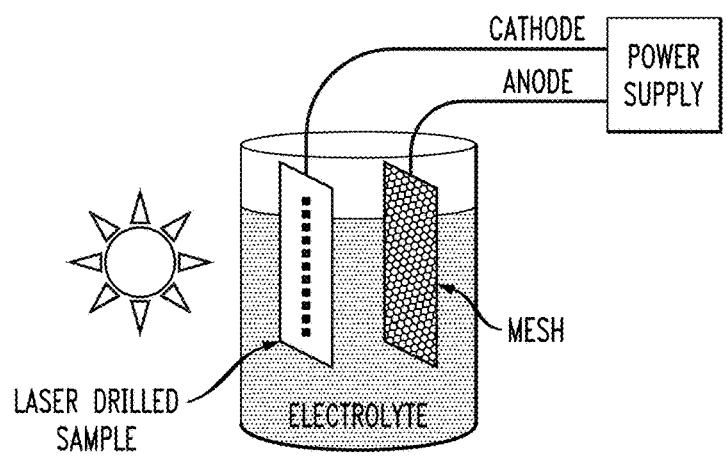
FIG. 17 is a schematic illustration of a beaker-scale plating and sample setup.
FIG. 18 shows a table summarizing results on the impact of post laser drill etch and pre-plate surface preparation on Ni/Cu plating coverage.

In order to electroplate at the required current density, a practical plating current and an appreciable area for plating are established. The vias themselves have an insufficient platable surface area to reach a practical plating current. Therefore, an area on the sample front side was outlined with plating lacquer and subsequently etched using a confined HF puddle to remove the SiN—this allowed for an accurate current density calculation to be made from a known platable area. An HF surface preparation of the via sidewall was employed to achieve sufficient nucleation during plating. The sample coupons had aluminum back contacts, so in order to avoid etching of the aluminum by the HF, a lacquer mask was also used to define and localize the backside etch. Plating was performed using a beaker scale bench top setup as shown in FIG. 17.

The pre-plating surface preparation splits were:
No HF etch
2:1 DHF (dilute hydrofluoric) with surfactant 2 minutes backside only
2:1 DHF with surfactant 2 minutes backside+20 minutes frontside
(to remove SiN)

The details of the plating procedure are as follows:
Light induced plating
Clip contact backside Al
Plate using submersion method
Ni: ~20 mA/cm$^2$; 30 Klux; 80 seconds
Cu: ~20 mA/cm$^2$; 5 Klux; 10 minutes.

Figure 19:
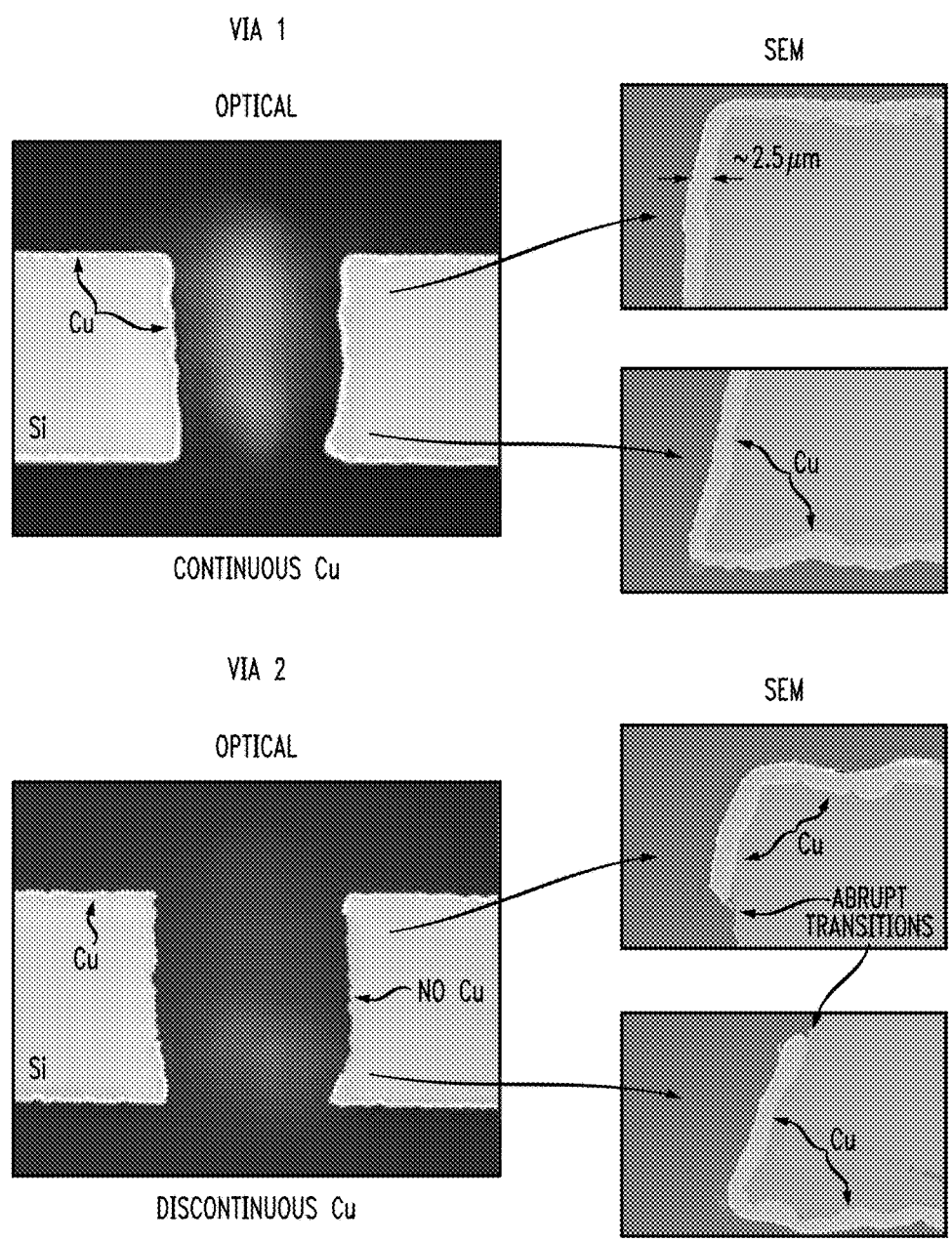
FIG. 19 shows cross sectional images of vias following saw damage etch (SDE) treatments (5×) with front and backside HF etch before Ni/Cu plating.

An experimental matrix, consisting of the four post-laser drill etches and the three preplate surface preparations described above, was used to assess the impact of each on plating. The results are summarized in the table shown in FIG. 18. There were two clear trends observed: 1) the degree of plating coverage is dependent on the post laser etch, with increased coverage associated with decreased roughness, and 2) the degree of plating coverage is strongly dependent on inhibition layer removal, with variability of HF wetting playing a critical role. A number of vias from the group 5×SDE (five times the etch period of the 1×SDE (saw damage etch)) in FIG. 18 with HF front and back etch were cross sectioned to assess plating coverage. A non-limiting example of a saw damage etch is an HF/HNO$_3$ solution. FIG. 19 shows images of two vias, one with continuous uniformly thick coverage and one with intermittent coverage. In the case of the intermittent coverage, there is an abrupt transition between the plated and non-plated region which highlights the critical impact of the insufficient inhibition layer removal. Silicon nitride on via sidewalls may contribute to non-continuous plating thereof.

The submersion etch method described above is not feasible in commercial cell fabrication as it would etch off the surface texture and increase reflection. In an attempt to avoid this issue, a single-side etch process was explored to determine impact of removing 5-10 µm of material from the laser entry or exit surfaces. The removal was evaluated from both the laser entry and exit sides. The 70 µm diameter direct drilled vias tested appear similar for both the 5 µm and 10 µm removal and from either laser entry and exit etch sides. They were relatively residue free but exhibited "worm" holes on the via sidewalls. The larger, radially drilled vias appear similar for both the 5 µm and 10 µm removal etches as well. In general, the single-side etch shows more variability compared to the initial submersion etch. Etching from the laser entry side seems to provide more consistent results. Using the single-side post-drill etch, the smaller radially drilled vias appear to have more residue. Plating coverage does not appear to be dependent on via diameter in the 70-280 µm size range.

Figure 20:
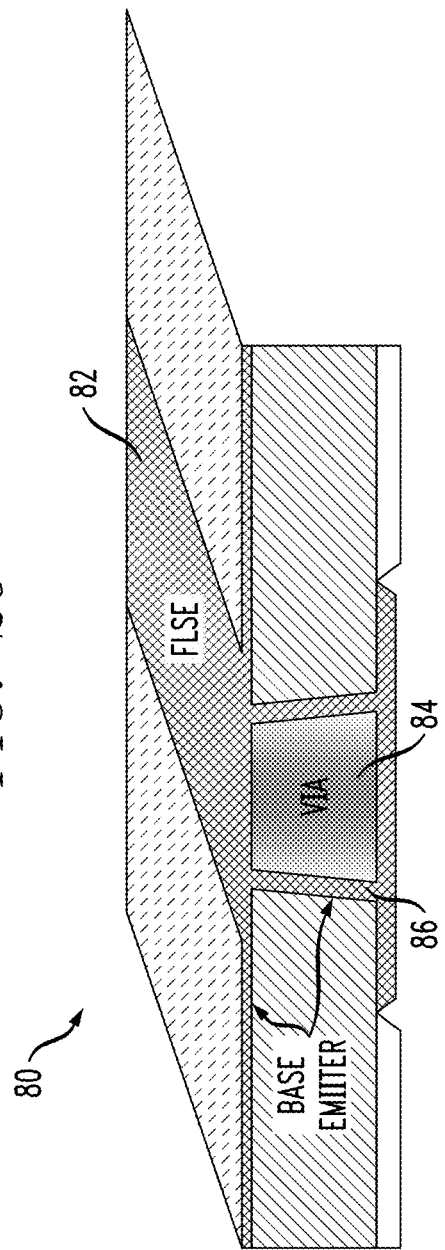
FIG. 20 shows a schematic illustration of an exemplary cell including an emitter lined emitter and a front surface FLSE.
Figure 21A:
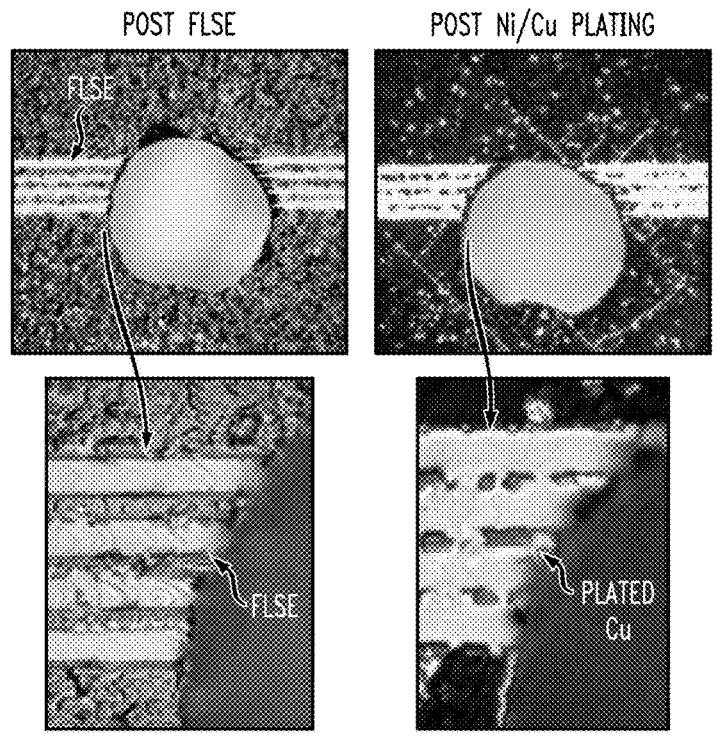
FIG. 21A shows optical images before and after plating for a cell having an MWT/FLSE combination.
Figure 21B:
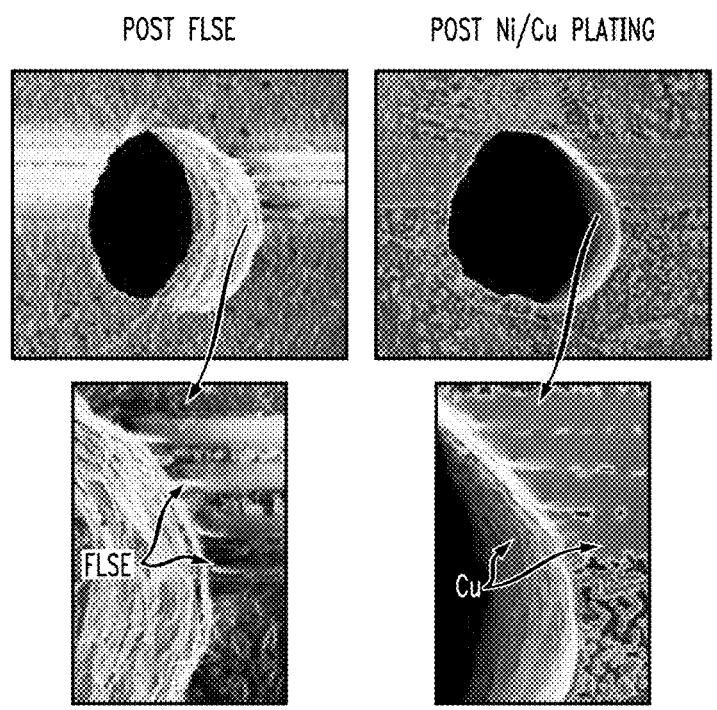
FIG. 21B shows SEM images before and after plating a cell having an MWT/FLSE combination.

The simultaneous plating of an emitter lined via and a front surface FLSE is performed in some embodiments of the methods disclosed herein. A cell structure 80 for this is illustrated in the schematic in FIG. 20. The FLSE 82 would intercept a via 84 and electrically contact the field emitter 86 on the via sidewall. The samples used had a 5 µm post-drill etch on the laser entry side. Samples were processed with the inhibition layer etch (HF) and the Ni/Cu plating process described above. Optical images of the sample before and after inhibition layer etch showed etch rings in SiN due to wicking of HF through the vias. Optical and SEM images shown in FIGS. 21A and 21B respectively clearly show plating on both the via sidewall as well as the FLSE pattern.

Figure 23A:
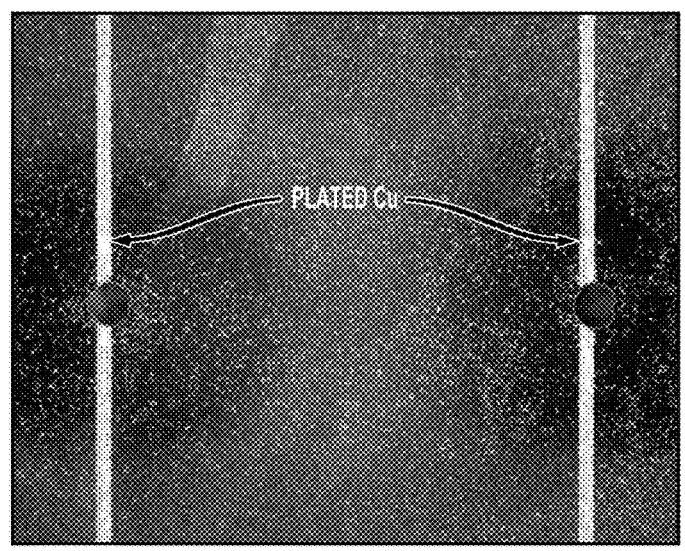
FIGS. 23A and 23B show front and back optical images, respectively, of sample cell post-preparation and plate.
Figure 23B:
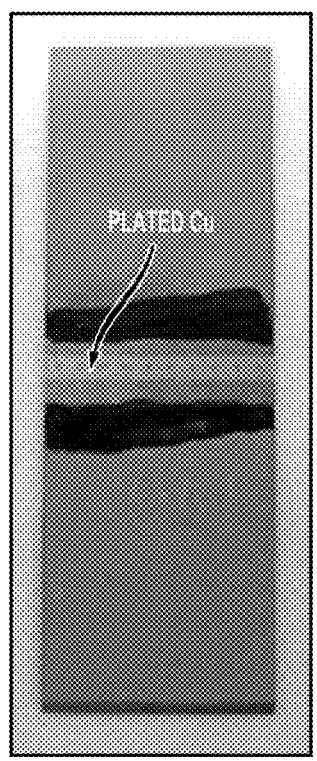

A metallized MWT IFLSE structure provides an excellent vehicle to make via resistance measurements. A cell structure 90 used for this measurement is illustrated schematically in FIG. 22. The measurements were made using a four point probe method contacting the top of one via 92 and the top of an adjacent via 94. A plated FLSE 96 provided landing pads for the contact probes as shown in the schematic illustration. The vias were all electrically connected by a backside strip 98, which was simultaneously plated during via and FLSE plating. The samples used for this measurement had a via diameter of 190 µm and had the 5 µm post-drill etch. Pre-plate surface preparation and Ni/Cu plate were used for metallization. Optical images of both the front and back side of a sample post prep and plate are shown in FIGS. 23A and 23B. Copper plating times of ten, twenty and thirty minutes were used to track via resistance as a function of copper thickness. Profilometry measurements across the plated FLSE regions were used to evaluate copper thickness. Measured thickness increased with increasing plating time but not proportionally, probably due to variations in the plating area from sample to sample which could lead to variations in current density. The sample plated for thirty minutes had a measured Cu thickness of ~4 µm and a total resistance from via-to-via of 9 mohms. This yields a via resistance for this conservative Cu thickness of <5 mohms per via, which is consistent with the target range of 3-10 mohms/via. The samples plated for ten and twenty minutes, respectively, had measured Cu thicknesses of about two and 3.5 µm, respectively, and via resistances of twenty-eight and eleven mohms, respectively.

Figure 24:
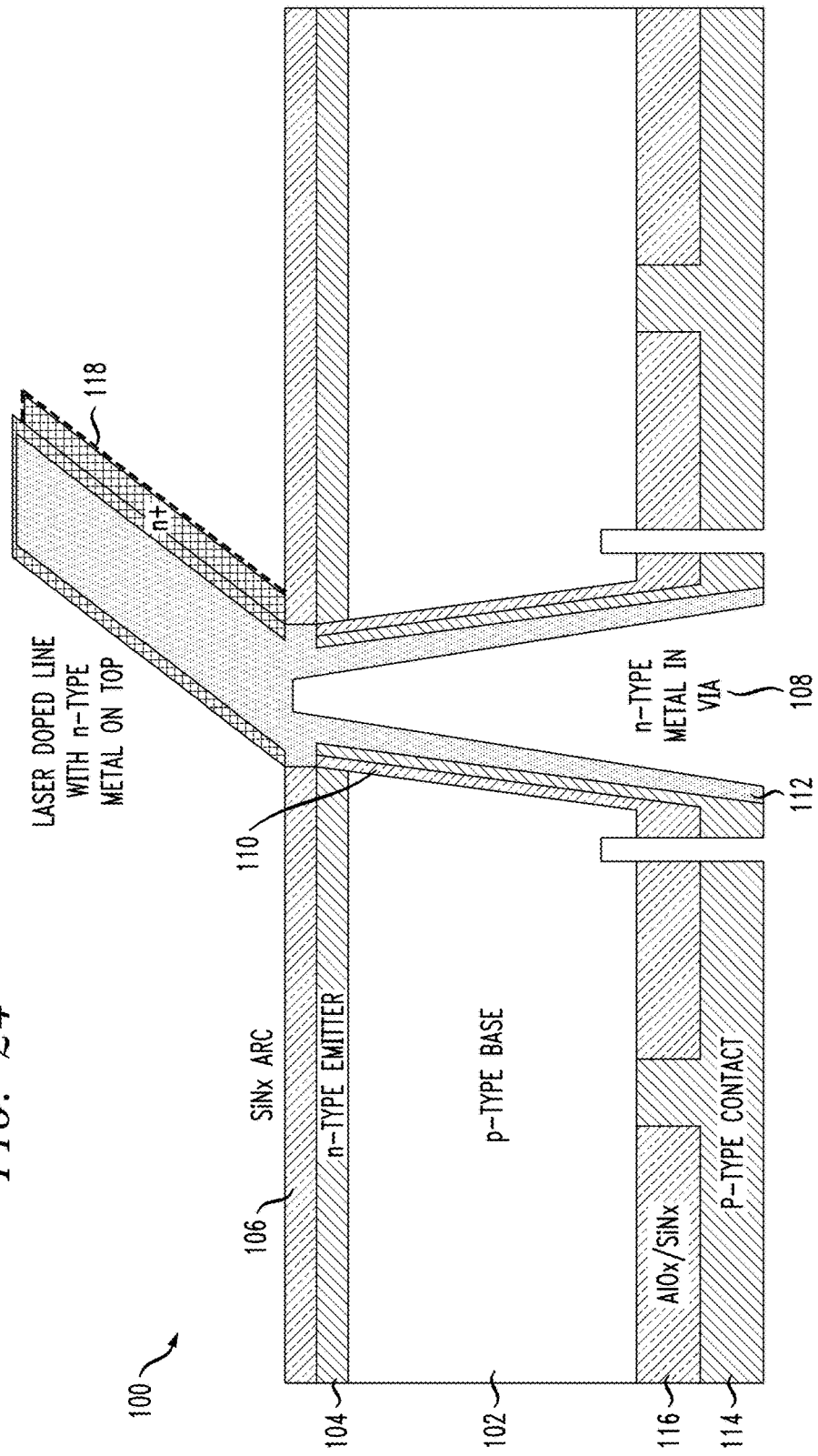
FIG. 24 shows a schematic illustration of a dielectric passivated via cell structure.
Figure 25A:
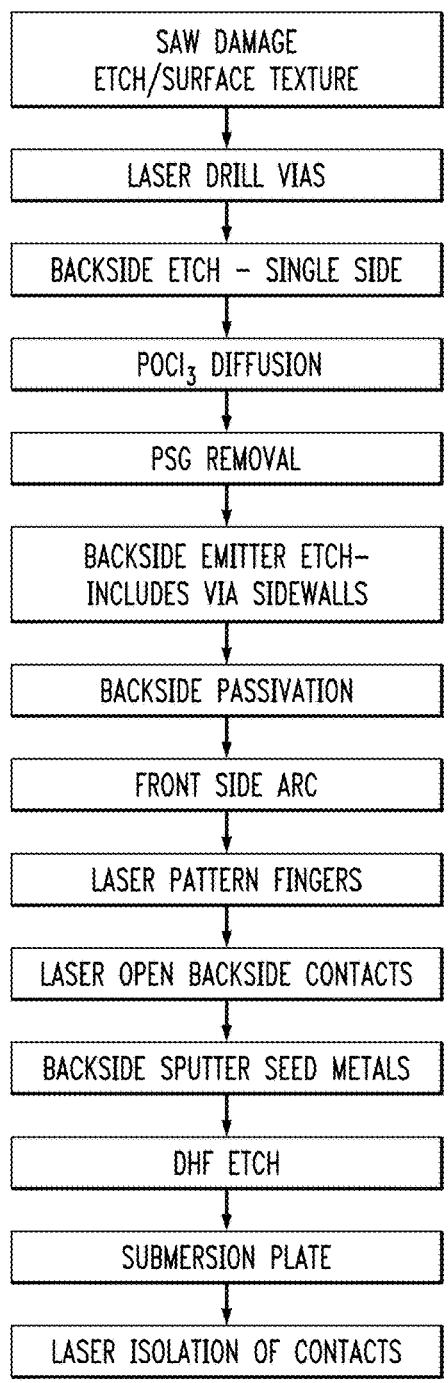
FIGS. 25A and 25B show exemplary flow charts for fabricating dielectric passivated via cell structures.
Figure 25B:
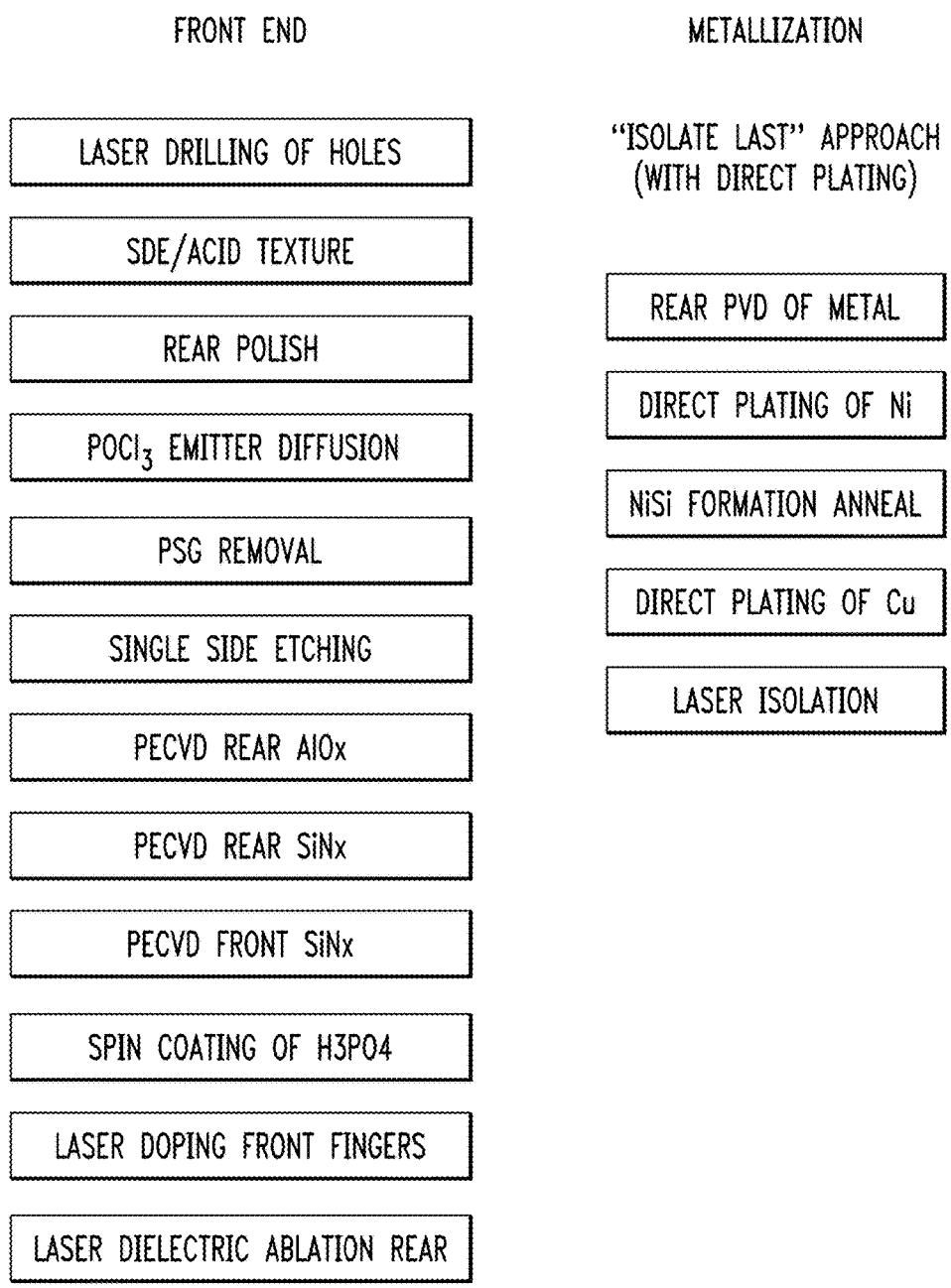

An alternative cell structure and integration approach provided in accordance with further embodiments is referred to herein as a "dielectric passivated via" MWT structure. The primary attribute of this approach is the combination of back surface passivation (BP) with MWT/FLSE. A schematic of an exemplary alternative cell structure 100 is provided in FIG. 24. The exemplary structure 100 includes a p-type silicon base 102, an n-type emitter 104, a silicon nitride ARC layer on the emitter 104, and a via 108. It will be appreciated that the structure includes a plurality of vias in some embodiments. The via 108 includes a dielectric surface layer 110 and a continuous metal layer 112 that directly contacts the dielectric surface layer 110 of the via. An axial opening through the via is bounded by the continuous metal layer 112. The back side of the structure 100 includes a p-type contact 114 electrically isolated from the metal layer 112. A dielectric layer 116, which is formed with the dielectric surface layer 110 of the via in some embodiments, adjoins the back surface of the base 102 and is positioned between the base and the p-type contact 114. A laser-doped line 118 including a portion of the metal layer 112 thereon is provided on the top of the structure 100. An exemplary process for the fabrication of photovoltaic cells with an electroplated front surface finger grid pattern electrically connected through electroplated vias to interconnects on the back surface of the cells is described further below. The process, like the processes described above with respect to the emitter lined via cell structures discussed above, utilizes laser drilling to create the through holes in the silicon substrate. The exemplary process further includes laser patterning of the fingers on the front surface of the photocell. Moreover, the process allows simultaneous plating of the back surface, via sidewalls, and front grid fingers, minimizing cost and manufacturing time. FIG. 25A provides a flow chart showing an exemplary process sequence for electroplating through wafer interconnects. An alternative process flow, similar to that shown in FIG. 25A, is shown in FIG. 25B. FIG. 25B separates front end processing from the metallization steps.

The exemplary processes include steps as discussed above, including saw damage etch(SDE)/surface (acid) texture, POCl$_3$ emitter diffusion, PSG (phosphorus silicate glass) removal, and front side PECVD (plasma enhanced chemical vapor deposition) SiN as an antireflection coating. Other steps are particularly tailored to obtaining the "dielectric passivated via" MWT (metal wrap through) structure such as that shown in FIG. 24. This process has been demonstrated with both direct drilled and radially cut vias varying in diameter from about 70 to 300 µm. Vias with a slightly conical shape are preferably obtained, with the larger diameter opening on the back surface of the cell. This enhances coverage of the via sidewalls by chemical treatments or depositions from the back side of the wafer and minimizes depositions from single-sided treatments from the front side. As discussed above, both types of laser drilling leave the sidewalls of the vias very rough and often with residues from the laser drilling process. The roughness and residue make continuous plating of the via sidewalls very difficult and unreliable. The single sided etch process discussed above that removes residue and smooths the sidewalls of the vias while leaving the front surface texturing unmodified is accordingly employed.

Since the vias are drilled prior to emitter diffusion ($POCl_3$ diffusion step) in the exemplary process sequences shown in FIGS. 25A and 25B, the via sidewalls, as well as the front and back surfaces of the cell will have a thin layer of doped silicon. It is necessary to remove the emitter from the back surface of the cell, and preferable to also remove it from the sidewalls of the vias. This can be accomplished using a standard back surface emitter etch. With the emitter removed from the via sidewalls, they can be effectively passivated using the same dielectric stack that is optimized for the back surface of the cell—an aluminum oxide/silicon nitride stack in the case of this exemplary embodiment. The step of "backside passivation" shown in FIG. 25A includes the deposition of the exemplary dielectric stack while the sequence provided in FIG. 25B shows the deposition of each individual dielectric material. The deposition of the front surface ARC ("front side ARC" in FIG. 25A, "PECVD front $SiN_x$" in FIG. 25B) may also contribute to the dielectric coverage of the via sidewalls. For previously cleaned and etched vias, the sidewalls will be effectively covered during the backside and frontside dielectric depositions. It will be appreciated that, in forming the "dielectric passivated via" MWT structure, the step of laser drilling as shown in FIGS. 25A and 25B can alternatively be conducted after the $POCl_3$ diffusion step.

Figure 26A:
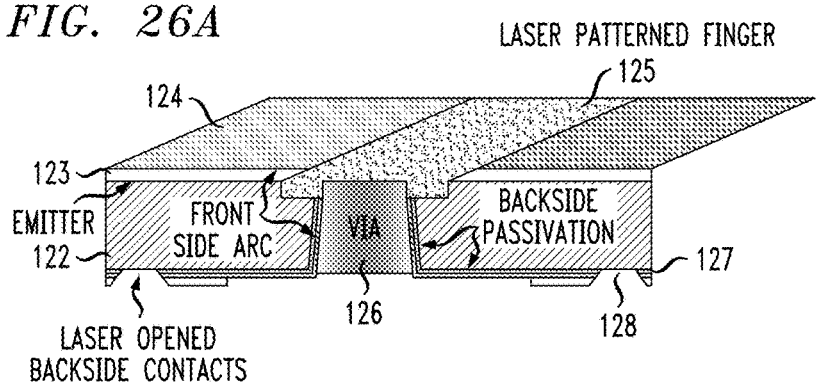
FIGS. 26A-26D are schematic representations of metal seed and plating schemes to provide simultaneous plating of via sidewalls and front and back contacts.
Figure 26B:
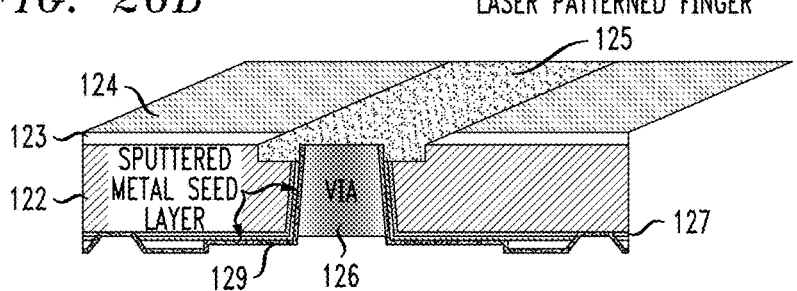

Laser patterning for fine line selective emitter formation is known in the industry. For this exemplary process sequence, laser patterning (with or without the use of additional dopants to form selectively doped back contacts) is used to open localized back contacts. One of the advantageous features of this exemplary fabrication method is the ability to simultaneously plate the back surface, via sidewalls, and fine line selective fingers on the front surface of the cell. This process is shown schematically in FIGS. 26A-D. This is accomplished by sputtering a metal seed stack (in this example it consists of 50 nm Ti, and 1 µm of copper) after opening backside contacts through the backside passivation layers and prior to plating the terminal metallurgies. A structure 120 as shown in FIG. 26A includes a base 122, and emitter 123 on the front side of the base 122, an ARC layer 124 over the emitter, a laser-patterned finger 125, and a via 126 including an axial passage extending through the base and finger. A backside passivation layer 127 is formed on both the backside of the base 122 and the surface of the via 126. The dielectric layer used to form the ARC layer 124 also covers the backside passivation layer 127. Openings 128 are formed in the backside passivation layer 127 that expose portions of the base 122.

Figure 26C:
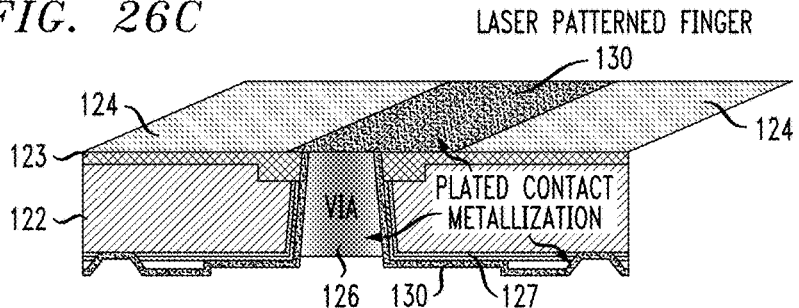
Figure 26D:
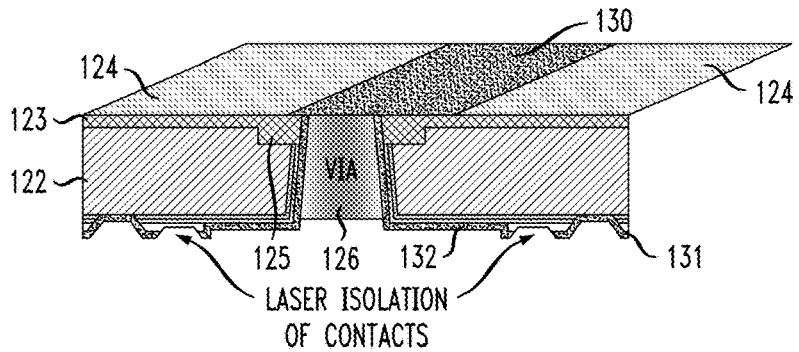
Figure 27:
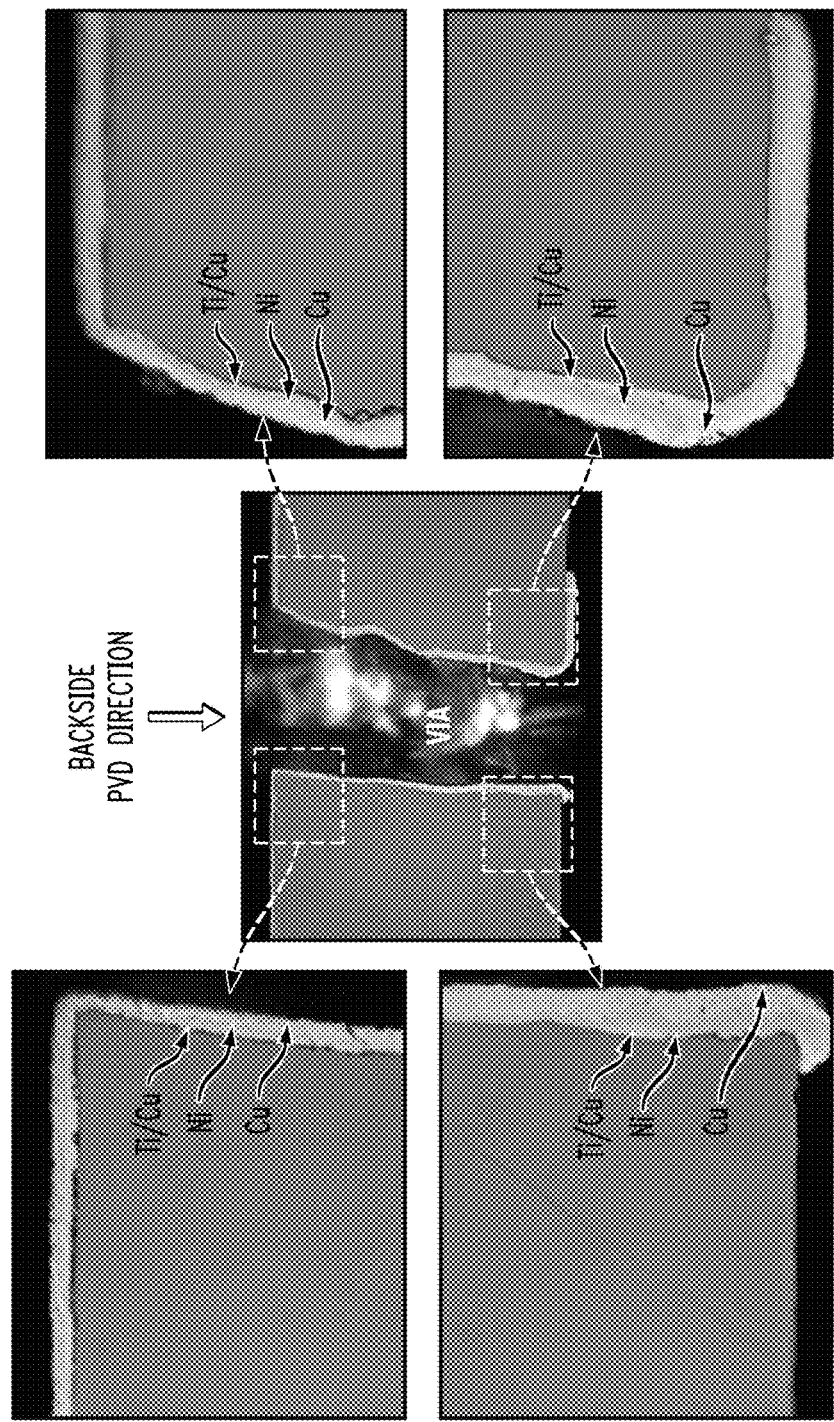
FIG. 27 shows cross sectional images of a via demonstrating continuous plating of electroplated nickel and copper on Ti/Cu sputtered seed layers.

The sputtered seed layer 129 (FIG. 26B) formed in the exemplary process makes ohmic contact with the base 122, has good adhesion to the backside passivation layer 127, and acts as a barrier to diffusion of the plated metallurgy. The surface of the seed layer 129 nucleates well when plating the terminal metallurgies. The deposition of the seed layer 129 also forms a sufficiently continuous coating on the via sidewalls to produce a uniform and continuous plated layer 130 as shown in FIG. 26C. A titanium/copper sputtered seed layer is employed in some embodiments. Continuous electroplated nickel and copper on the via sidewalls after submersion plating, as shown in FIG. 27, is further described below. Laser isolation of the base and emitter contacts 131, 132 on the backside of the cell is shown in FIG. 26D.

As mentioned previously, one of the advantageous features of this exemplary process is the simultaneous plating of the vias and the front and back surfaces of the cell, such as shown in FIGS. 26A-26D. This requires good electrical contact between the laser patterned fingers on the frontside to the metal seed layers in the vias. As discussed below, simultaneous plating of front, back, and via surfaces are reproducibly obtained. Moreover, this process does not require light induced plating of the fingers on the frontside (as is necessary for many front grid plating schemes), but can be accomplished by simpler and less expensive techniques such as submersion plating.

The fabrication of the dielectric-passivated via MWT cell structure in an exemplary embodiment includes via sidewall emitter removal and dielectric and seed metal coverage along the via sidewall. Additionally, the rear side PVD metal electrically contacts the frontside FLSE for simultaneous plating of the PVD seed and FLSE.

Removal of the emitter from the via sidewall facilitates proper passivation. An $AlO_x/SiN_x$ back surface dielectric stack is employed in an exemplary embodiment of the process for passivation of the via sidewall. The emitter on the via sidewall was targeted to be removed during the single-side backside emitter etch. (See FIG. 25.) A set of samples with 2 µm and 5 µm target backside removal etches were fabricated as detailed in the table shown in FIG. 28. The primary splits include frontside SiN deposited before and after emitter etch, and thermal oxidation before emitter etch.

The metric used to evaluate the presence of the emitter was electroplating of metal using light-induced plating (LIP). For a well isolated p-n junction and with sufficient light, metal only deposits on the n-type emitter surface during LIP. FLSE patterns were added to the sample structures to provide areas with exposed emitter. The overall sample processing was as follows:

Laser drill vias;
KOH etch (removes via sidewall roughness);
POCl diffusion/PSG etch (emitter formation);
Single-side emitter etch (via sidewall emitter removal?);
Frontside PECVD SiN;
Screen/fire backside Al contact;
$H_3PO_4$ coat/FLSE pattern;
Via plating:
Inhibition layer removal (e.g. HF)
Light-induced Ni/Cu plate.

For 250, 160, 100 and 70 µm diameter vias, plating occurred on all the FLSE regions, with no plating in the exposed base regions on the backside. A portion of the 70 µm diameter vias did show plating along the perimeter of the backside via rim. SEM inspection of the via sidewalls showed no copper plating of the 250, 160 and 100 µm vias, though many of the 70 µm vias were indeed plated. This observation confirms that the single-side emitter etch does remove the emitter from the back surface as well as the via sidewalls for vias down to 100 µm in diameter. The presence of plating on the 70 µm diameter via sidewalls indicates incomplete removal of the emitter, potentially due to poor wetting, bubble formation or air entrapment during the single-side emitter etch. This result also demonstrated that for LIP, an exposed emitter restricts plating to the n-type surface and prevents plating on any exposed p-type surface.

One of the primary elements of the dielectric passivated via MWT cell structure is dielectric passivation of via sidewalls. The passivating dielectric employed in an exemplary embodiment is a PECVD $AlO_x/SiN_x$ stack which is used for the back surface passivation. Continuous dielectric coverage on the via sidewalls is important to avoid high surface recombination as well as shunting after metallization. To evaluate dielectric coverage, samples were prepared as detailed in the table shown in FIG. 29 and characterized by cross section SEM. A sputtered Ti/Cu capping layer was used to aid in delineating the top surface dielectric. Cross section SEM images of the 280, 160, and 70 µm diameter vias were obtained after laser drill, etch, dielectric deposition, and metal capping. The dielectric stack was thicker than targeted. A low density loosely adherent layer was observed below the dielectric layers. The dielectric thickness decreased along the depth of the vias, moving away from the deposition side. The dielectric coverage was clearly dependent on via shape and sidewall angle and was rarely observed at the end of the via furthest from the deposition side. The lower portion of the 70 µm diameter vias had no apparent sidewall dielectric, potentially due the typical hour glass shape of these vias. In order to implement this type of cell structure, dielectric deposition and thickness optimization would be required to ensure continuous coverage along the via side walls.

The fabrication of the dielectric passivated via sidewall cell structures includes the deposition of a metal seed layer. The seed layer is deposited onto the back surface of the cell and forms a continuous layer along the via sidewalls. A Ti/Cu seed stack provides adhesion to the dielectric and a nucleation surface for plating. Deposition by both evaporation and sputtering were explored and characterized for via sidewall coverage. Samples with the extreme via diameters (280 µm and 70 µm) were used for comparison. A 50 nm Ti/500 nm Cu stack was deposited both by sputtering and evaporation, followed by electroplated copper to aid in characterization. The evaporated seed coverage is strongly dependent on via profile and sidewall topography, due to the line of sight nature of the deposition. Positive tapered sidewalls have continuous coverage for both the 280 µm and 70 µm diameter vias, while negative tapered sidewalls and re-entrant profiles inhibited coverage. Sputtered Ti/Cu seed coverage was less dependent on via profile and sidewall topography. The 280 µm diameter vias have continuous coverage while the 70 µm diameter vias have variable coverage, potentially due to an aspect ratio effect.

Figure 30A:
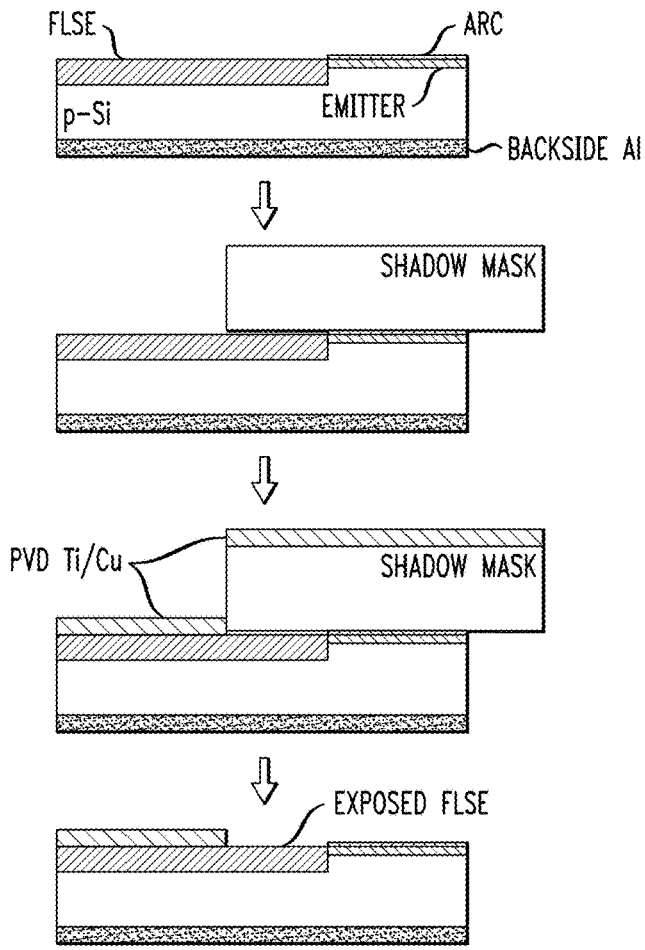
FIG. 30A shows schematic illustrations of planar test structures with FLSE for simultaneous plating evaluation.
Figure 30B:
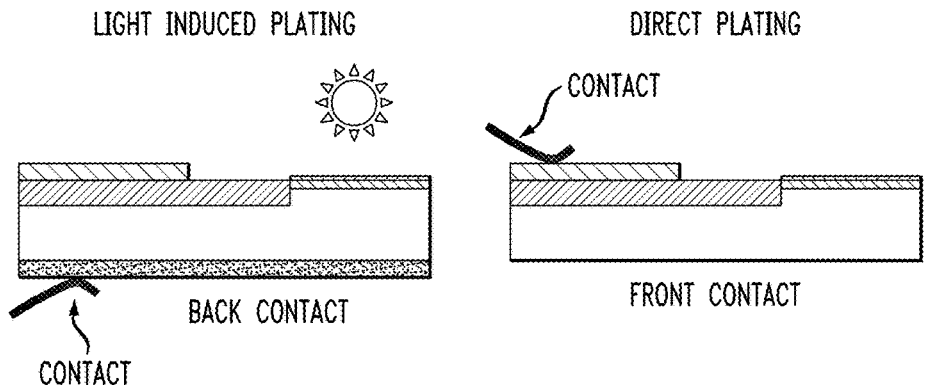
FIG. 30B shows schematic illustrations of structures and contact schemes for back contact light induced plating (LIP) and direct plating evaluation.

The ability to simultaneously plate the PVD seed and laser doped n-type emitter is an advantage of dielectric passivated via integration as disclosed herein. To evaluate this, planar test structures with FLSE were fabricated and plated, as illustrated in FIG. 30A. Both LIP and direct plating were explored by using samples with and without an aluminum back contact and altering the contacting scheme accordingly, as illustrated in FIG. 30B.

A Ti/Cu PVD seed stack was used and it was subsequently plated with nickel. Achieving plating of the FLSE required good electrical contact between the laser doped regions and metal seed. It also required removal of any surface oxide. Simultaneous plating of nickel onto both PVD Ti/Cu and n-type FLSE, for both back contact LIP and front contact direct plating, was obtained.

Simultaneous plating of a sputtered seed and FLSE can be obtained despite the complexity of the geometric effect of an actual cell structure. Sample cells were fabricated as follows:

Laser drill vias
    KOH etch (remove via sidewall roughness)
    POCL$_3$ diffusion/PSG etch
    Single side emitter etch
    Rear side PECVD 500A AlO$_x$/750A SiN$_x$
    Front side PECVD 800A SiN$_x$
    Screen/fire backside Al
    H$_3$PO$_4$ coat/FLSE pattern
    Rear side sputter 500A Ti/1 µm Cu
    10:1 DHF with surfactant etch of FLSE
    1 min. Ni/5 min. Cu plating (~20 mA/cm$^2$)
        with light
        without light.

Figure 31:
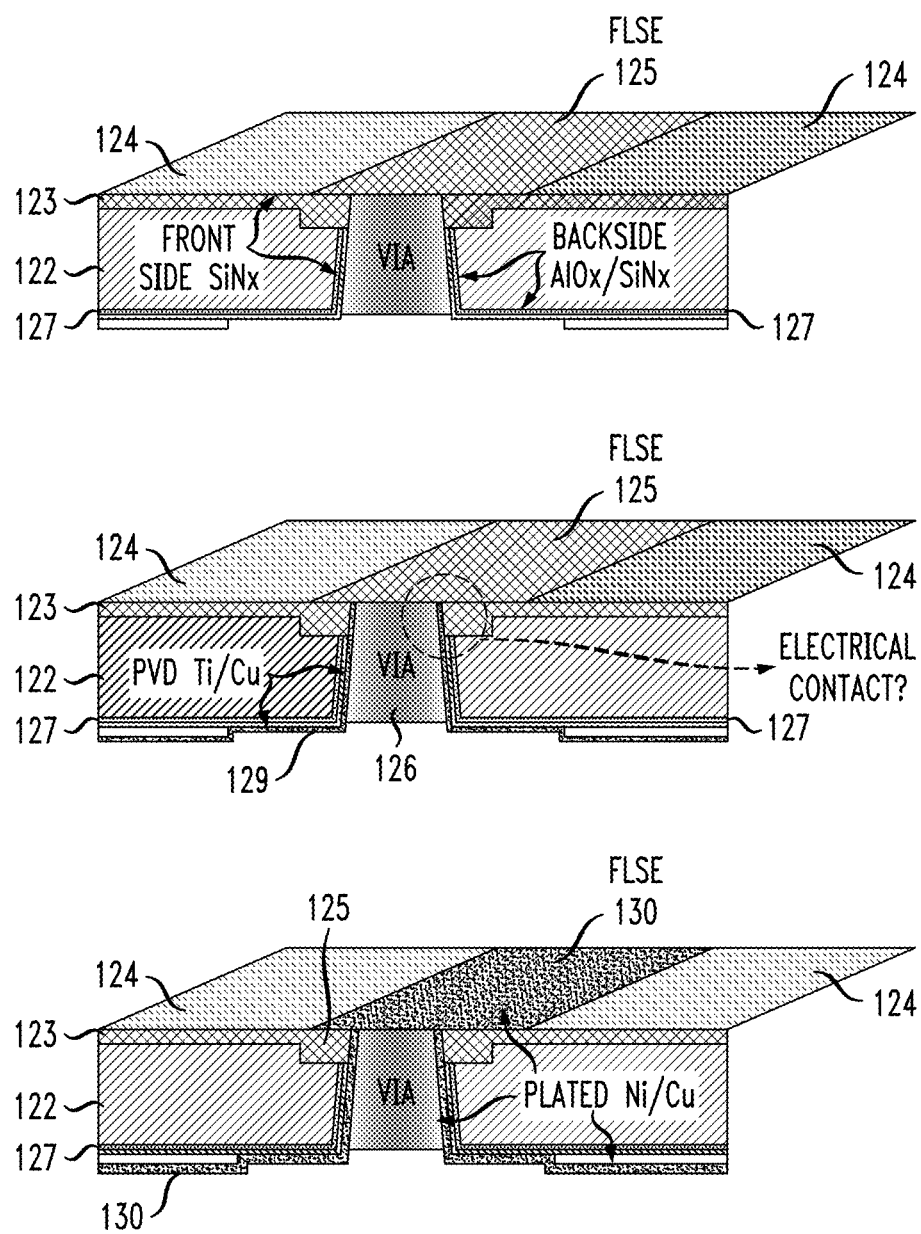
FIG. 31 shows a schematic of a metallization process for a cell including a dielectric passivated via incorporating metal wrap through (MWT) technology.

In addition to the challenges of dielectric and PVD seed via sidewall coverage, the simultaneous plating of the actual structure requires that the PVD seed make electrical contact to the laser doped FLSE on the front surface. FIG. 31 shows an exemplary metallization process for a dielectric passivated via MWT photocell. The same reference numerals are employed in FIG. 31 as in FIGS. 26A-26D to designate similar elements.

The initial samples were plated with and without light to establish that the pre-plating HF etch was sufficient to remove any oxide on the FLSE. Optical images from the front and back of the vias for via diameters of 280, 160, and 70 µm show that both the back surface and FLSE are plated for all via diameters with and without light. Further characterization was performed on the samples processed without light to assess the via sidewall coverage and continuity at the FLSE/via rim intersection. SEM images and FIB sections obtained after nickel/copper plating demonstrated continuity of the nickel/copper plated layers between the via sidewall and FLSE for all three via diameters. Polished cross section images show continuous metal layers along the sidewalls of the 280 µm and 160 µm diameter vias while variability in via sidewall metal continuity for the 70 µm diameter vias. As discussed above with respect to the PVD seed coverage evaluation, the metal continuity for 70 µm diameter vias is dependent on via shape and sidewall topography. Aggressive topography and sharp ledges result in metal layer discontinuity.

Given the discussion thus far, and with reference to the drawings and accompanying disclosure, an exemplary method for fabricating a photovoltaic device includes obtaining a substrate comprising silicon and including a front side and a back side. One or more vias are drilled through the substrate using a laser. Each of the one or more vias includes a sidewall. The method further includes smoothing the sidewall of each of the one or more vias, forming a doped emitter on at least the front side of the substrate, forming an electrically conductive contact pad on the back side of the substrate, and forming an antireflective coating on the doped emitter. A continuous, electrically conductive layer is plated on each sidewall of the one or more vias, thereby forming one or more plated vias, each plated via having axial opening. The continuous, electrically conductive layer of each of the one or more plated vias is electrically connected to the doped emitter. In some embodiments of the method, the step of laser drilling one or more vias further includes drilling from the back side of the substrate towards the front side thereof to form one or more conical vias, each of the one or more vias having a back side diameter larger than a front side diameter thereof. FIG. 7 provides a schematic illustration of a via including conical side walls. The table in FIG. 13 provides exemplary via diameters while optical images of the front and rear surfaces of laser drilled vias are shown in FIG. 14. In one or more embodiments, the method further includes the steps of patterning emitter contacts on the front side of the substrate and plating the continuous, electrically conductive layer on the emitter contacts in addition to the sidewall. FIG. 6 shows a laser patterned finger formed on the front side of the substrate and the plating of the via sidewall as well as the finger. In some embodiments, simultaneous plating of via side walls and front and back contacts is performed. Base and emitter contacts, both of which are accessible from the back side of the device in some embodiments, are electrically isolated.

An exemplary photovoltaic device includes a base comprising silicon and having a front side and a back side. A doped base emitter adjoins the front side of the base and a doped, selective emitter adjoins the base emitter. An antireflective coating is on the doped base emitter. One or more vias extends through the base and the doped, selective emitter, each of the one or more vias including a sidewall and an axial passage. An electrically conductive layer is on the sidewall of each of the one or more vias and bounds each axial passage. The electrically conductive layer electrically connects the doped, selective emitter and the back side of the base. FIG. 6 shows one exemplary embodiment including an emitter-lined via. FIG. 26D shows a further embodiment wherein the via of the photovoltaic device includes a dielectric layer. In some embodiments of the devices including emitter-lined via(s), a dielectric passivation layer has a first portion on the sidewall of each of the one or more vias and a second portion on the back side of the base, the electrically conductive layer being positioned on the first and second portions of the dielectric layer. Base and emitter contacts formed on the back side of the cell from the electrically conductive layer in one or more embodiments are electrically isolated, such as shown in FIG. 26D. The one or more vias have diameters between 70-300 µm in some embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A method for fabricating a photovoltaic device, comprising:
    obtaining a substrate comprising silicon and including a front side and a back side;
    laser drilling one or more vias through the substrate, each of the one or more vias including a sidewall;
    smoothing the sidewall of each of the one or more vias;
    forming a passivation layer on the sidewall of each of the one or more vias and on the back side of the substrate;
    depositing a metal seed layer on the passivation layer
    forming a first portion of a doped emitter on the sidewall of each of the one or more vias and a second portion of the doped emitter on the front side of the substrate, the first and second portions of the doped emitter being continuous;
    patterning emitter contacts on the front side of the substrate;
    forming an electrically conductive contact pad on the back side of the substrate;
    forming an antireflective coating on the doped emitter;
    laser opening back side contact openings through the passivation layer on the back side of the substrate;
    forming doped, back side contacts extending through the passivation layer on the back side of the substrate;
    plating a continuous, electrically conductive layer on each sidewall of the one or more vias and the emitter contacts subsequent to forming the passivation layer and depositing the metal seed layer on the passivation layer, thereby forming one or more plated vias, each plated via having an axial opening, the continuous, electrically conductive layer of each of the one or more plated vias being electrically connected to the doped emitter, wherein plating the continuous, electrically conductive layer on each sidewall further includes simultaneously plating the back side of the substrate including the back side contacts, and
    electrically isolating the back side contacts following plating from the plated, electrically conductive layer on one of the sidewalls.

2. The method of claim 1, further including removing the first portion of the doped emitter prior to forming the passivation layer.

3. The method of claim 1, wherein the one or more vias have diameters between 70-300 µm.

4. The method of claim 3, wherein the emitter contacts comprise laser patterned fingers.

5. The method of claim 1, wherein the doped emitter has n-type conductivity.

* * * * *